(12) United States Patent
Dichtel et al.

(10) Patent No.: US 11,213,800 B2
(45) Date of Patent: Jan. 4, 2022

(54) COVALENT ORGANIC FRAMEWORK FILMS, AND METHODS OF MAKING AND USES OF SAME

(75) Inventors: William R. Dichtel, Ithaca, NY (US); Jiwoong Park, Ithaca, NY (US); Arnab Mukherjee, West Bengal (IN); Mark Philip Levendorf, Ithaca, NY (US); Arthur Woll, Ithaca, NY (US); Eric Spitler, Ithaca, NY (US); John Colson, Ithaca, NY (US)

(73) Assignee: CORNELL UNIVERSITY, Ithaca, NY (US)

( * ) Notice: Subject to any disclaimer, the term of this patent is extended or adjusted under 35 U.S.C. 154(b) by 1291 days.

(21) Appl. No.: 13/821,136

(22) PCT Filed: Sep. 13, 2011

(86) PCT No.: PCT/US2011/051350
§ 371 (c)(1),
(2), (4) Date: Oct. 17, 2013

(87) PCT Pub. No.: WO2012/037090
PCT Pub. Date: Mar. 22, 2012

(65) Prior Publication Data
US 2014/0037944 A1    Feb. 6, 2014

Related U.S. Application Data

(60) Provisional application No. 61/382,093, filed on Sep. 13, 2010.

(51) Int. Cl.
*C09D 5/00* (2006.01)
*B01J 20/22* (2006.01)
(Continued)

(52) U.S. Cl.
CPC ......... *B01J 20/226* (2013.01); *B01J 20/3204* (2013.01); *B01J 20/324* (2013.01);
(Continued)

(58) Field of Classification Search
None
See application file for complete search history.

(56) References Cited

U.S. PATENT DOCUMENTS 7,582,798 B2    9/2009    Yaghi et al.
2009/0227697 A1  9/2009    Lavigne et al.
(Continued)

FOREIGN PATENT DOCUMENTS

WO    2009127896    10/2009

OTHER PUBLICATIONS

Cote, A.P., Benin, A.I., Ockwig, N.W., O'Keefe, M., Matzger, A.J., Yaghi, O.M. "Porous, Crystalline, Covalent Organic Frameworks" Science 310, 1166 (2005).*
(Continued)

*Primary Examiner* — Humera N. Sheikh
*Assistant Examiner* — Thomas A Mangohig
(74) *Attorney, Agent, or Firm* — Johnson, Marcou, Isaacs & Nix, LLC; Paul J. Roman, Jr.

(57) ABSTRACT

Multilayer structures comprising a covalent organic framework (COF) film in contact with a polyaromatic carbon (PAC) film. The multilayer structures can be made by combining precursor compounds in the presence of a PAC film. The PAC film can be for example, a single layer graphene film. The multilayer structures can be used in a variety of applications such as solar cells, flexible displays, lighting devices, RFID tags, sensors, photoreceptors, batteries, capacitors, gas-storage devices, and gas-separation devices.

20 Claims, 17 Drawing Sheets

(51) Int. Cl.
  *H01L 51/00* (2006.01)
  *B82Y 40/00* (2011.01)
  *B82Y 30/00* (2011.01)
  *B01J 20/32* (2006.01)
  *C01B 32/186* (2017.01)
  *C01B 32/21* (2017.01)
  *H01L 51/05* (2006.01)
  *H01L 51/50* (2006.01)
  *H01L 51/42* (2006.01)

(52) U.S. Cl.
  CPC ....... *B01J 20/3272* (2013.01); *B01J 20/3289* (2013.01); *B82Y 30/00* (2013.01); *B82Y 40/00* (2013.01); *C01B 32/186* (2017.08); *C01B 32/21* (2017.08); *C09D 5/00* (2013.01); *H01L 51/009* (2013.01); *H01L 51/0053* (2013.01); *H01L 51/0054* (2013.01); *H01L 51/0083* (2013.01); *H01L 51/0084* (2013.01); *C01B 2204/02* (2013.01); *H01L 51/0078* (2013.01); *H01L 51/0504* (2013.01); *H01L 51/42* (2013.01); *H01L 51/50* (2013.01); *Y02E 10/549* (2013.01); *Y10T 428/265* (2015.01); *Y10T 428/31504* (2015.04); *Y10T 428/31678* (2015.04)

(56) References Cited

U.S. PATENT DOCUMENTS

| | | | |
|---|---|---|---|
| 2010/0012972 A1* | 1/2010 | Kouvetakis | C30B 29/52 257/183 |
| 2010/0143693 A1 | 6/2010 | Yaghi et al. | |
| 2010/0224867 A1* | 9/2010 | Heuft | B82Y 10/00 257/40 |

OTHER PUBLICATIONS

Berger, C., Song, Z., Li, X., Wu, X., Brown, N., Naud, C., Mayou, D., Li, T., Hass, J., Marchenkov, A.N., Conrad, E.H., First, P.N., de Heer, W.A. "Electronic Confinement and Coherence in Patterend Epitaxial Graphene" Science May 26, 2006, vol. 312, Issue 5777, pp. 1191-1196.*

Colson et al, Oriented 2D Covalent Organic Framework Thin Films on Single-layered Graphene, Science 332, 228-231. Apr. 8, 2011.

Spitler et al., Lewis Acid-catalysed Formation of Two-dimensional Phthalocyanine Covalent Organic Frameworks, Nature Chemistry, 2, 672-677. Jun. 20, 2010.

Gutzler et al., Surface mediated synthesis of 2D covalent organic frameworks: 1,3,5-tris(f-bromophenyl)benzene on graphite(001), Cu(111), and Ag(110), Chem. Commun., 2009, 4456-4458.

Wan et al., A Photoconductive Covalent Organic Framework: Self-Condensed Arene Cubes Composed of Eclipsed 2D Polypyrene Sheets for Photocurrent Generation, Angew. Chem. 2009, 121, 554-5550.

Surface Mediated Synthesis of 2D Covalent Organic Frameworks: 1, 3, 5-tris (4-bromophenyl) benzene on graphite (001), Cu(111), and Ag(110), Rico Gutzler et al., Chem. Comm., Issue 29, pp. 4456-4458, and supplementary information. Jun. 12, 2009.

A Belt-Shaped, Blue Luminescent and Semiconducting, Covalent Organic Framework, Shun Wan et al., Agnew, Chem, Int. Ed., vol. 47, pp. 8826-8830. Sep. 30, 2008.

Yoo, Y., et al., Rapid fabrication of metal organic framework thin films using microwave-induces thermal deposition—Supplemental Information, Chemical Communications, Apr. 23, 2008, issue 21. Apr. 23, 2008.

Yoo, Y., et al., Rapid fabrication of metal organic framework thin films using microwave-induces thermal deposition, Chemical Communications, Apr. 23, 2008, issue 21, pp. 2441-2443.

* cited by examiner

COVALENT ORGANIC FRAMEWORK FILMS, AND METHODS OF MAKING AND USES OF SAME

CROSS-REFERENCE TO RELATED APPLICATIONS

This application claims priority to U.S. provisional patent application no. 61/382,093, filed Sep. 13, 2010, the disclosure of which is incorporated herein by reference.

STATEMENT REGARDING FEDERALLY SPONSORED RESEARCH

This invention was made with Government support under Grant Numbers CHE-0847926 and DGE-0654193 awarded by the National Science Foundation. The United States Government has certain rights in the invention.

FIELD OF THE INVENTION

The present invention generally relates to covalent organic framework films, methods of making such films, and uses of such films.

BACKGROUND OF THE INVENTION

Covalent organic frameworks (COFs) are an emerging class of materials that organize and align organic semiconductors predictably. COFs use reversible covalent bond-forming reactions to link molecular building blocks into periodic two-dimensional (2-D) or three-dimensional networks. The 2-D variants crystallize into layered structures containing stacked aromatic subunits ideal for interlayer exciton and charge transport. 2-D COFs exhibit several desirable and unique features. The length and relative orientation of their linking groups determine the lattice structure, in contrast to the unpredictable packing of traditional organic semiconductors. Also, their permanent porosity provides a continuous, high surface-area interface for additional functionalization.

COFs are a class of highly porous, purely organic crystalline materials that are held together by, for example, covalent bonds between boronic acids and polyalcohols. COFs can exhibit high thermal stability and the size of their pores can be precisely tuned. These properties make them promising candidates for gas storage, separation and catalysis.

One of the most exciting features of some COFs is a framework made up of π-stacked aromatic building blocks that creates porous networks with electronically coupled 'walls'. This property has recently inspired researchers to create the first semiconducting and photoconducting COFs using pyrene (a flat hydrocarbon made up of four fused benzene rings) building blocks. However, a significant problem with the COFs used at present is the lack of control over their nanoscale morphology and orientation. Consequently, unstructured random interphases between donors and acceptors are commonly created.

COFs containing phthalocyanines (large, planar macrocycles) and metallophtalocyanines have also been reported, and the nickel-phthalocyanine-based COFs fabricated were the first crystalline porous frameworks to exhibit high charge-carrier mobilities. All of these systems were, however, synthesized as insoluble bulk powders, with no control over the orientation of the pore system, making it difficult or impossible to incorporate the materials into devices or even measure their electronic properties precisely. As a result, it has not been possible to use COFs in functional devices such as photovoltaic cells or chemical sensors.

COFs are materials that have the potential to revolutionize the field of organic electronics. COFs offer a new way to organize organic semiconductors into structures for efficient charge transport. A second problem that currently limits COFs compared to traditional organic polymers is that their synthesis requires reaction times of 3 to 5 days. Thus, electronic devices (solar cells, transistors, light emitting diodes, RFID tags, batteries, supercapacitors, etc.) based on existing COF technology would likely be too expensive to be competitive.

BRIEF SUMMARY OF THE INVENTION

The present invention provides multilayer structures comprising a covalent organic framework (COF) layer in contact with a polycyclic carbon (PAC) layer. The COF layer can have one or more stacked 2-D COFs. The PAC layer in contact with the COF layer may be present on a substrate, such that the PAC layer is in between the COF layer and the substrate. The present invention also provides methods of making such structures and uses of such structures.

The invention is based on the surprising observation that two-dimensional (2-D) COF layers can be formed on, for example, a single-layer graphene (SLG) layer under operationally simple solvothermal conditions. The 2-D COFs stack normal to the SLG surface and show improved crystallinity compared with COF powders. To our knowledge the present invention provides COF layers that are more ordered than any COF sample previously reported in the scientific literature.

DETAILED DESCRIPTION OF THE INVENTION

The present invention provides multilayer structures, where a multilayer structure comprises a covalent organic framework (COF) film in contact with a polycyclic carbon (PAC) film. The present invention also provides methods of making such structures and uses of such structures.

COFs, in which molecular building blocks form robust microporous networks, are typically synthesized as insoluble and unprocessable powders. Surprisingly, the present invention provides, for example, two-dimensional (2-D) COF films on single-layer graphene (SLG) under operationally simple solvothermal conditions. The layered films stack normal to the SLG surface and show improved crystallinity compared with COF powders. For example, SLG surfaces supported on copper, silicon carbide, and transparent fused silica ($SiO_2$) substrates, have been used. Other examples of chemically distinct COF films grown on SLG exhibit similar vertical alignment and long-range order. For incorporation of COF materials in organic electronic devices, thin-film formation is desirable.

The present invention addresses challenges associated with COFs by, for example, synthesizing 2-D COF films on single layer graphene (SLG) coated surfaces. Without intending to be bound by any particular theory, it is considered that the graphene templates COF film formation, thereby providing, for example, highly crystalline films in as little as 15 minutes. SLG is a transparent and conductive material that allows spectroscopic and electronic characterization of COFs. To our knowledge the present invention provides COF films that are more ordered than any COF sample previously reported in the scientific literature. Ordering of the films is a desirable trait for electronic applications. Graphene (which itself is both highly conductive and 98% transparent) can, for example, be transferred to transparent surfaces, such as glass or silicone rubber, before growing the COF. This methodology may enable fabrication of improved solar cells or other light-responsive (e.g., photovoltaic devices) or light-emitting devices.

Photovoltaic performance can be improved by controlling both the packing and orientation of complementary organic semiconductors, but such order is difficult to design or achieve in molecular and polymeric optoelectronic materials. Surprisingly, the present invention provides, for example, oriented two-dimensional COF films of organized metallophthalocyanines. The films are periodic, permanently porous networks that are suited for vertical charge transport. These films are precursors of ordered heterojunctions. Such heterojunctions can require pores that accommodate complementary semiconductors, such as continuous networks of fullerenes or other electron acceptors.

Figure 4:
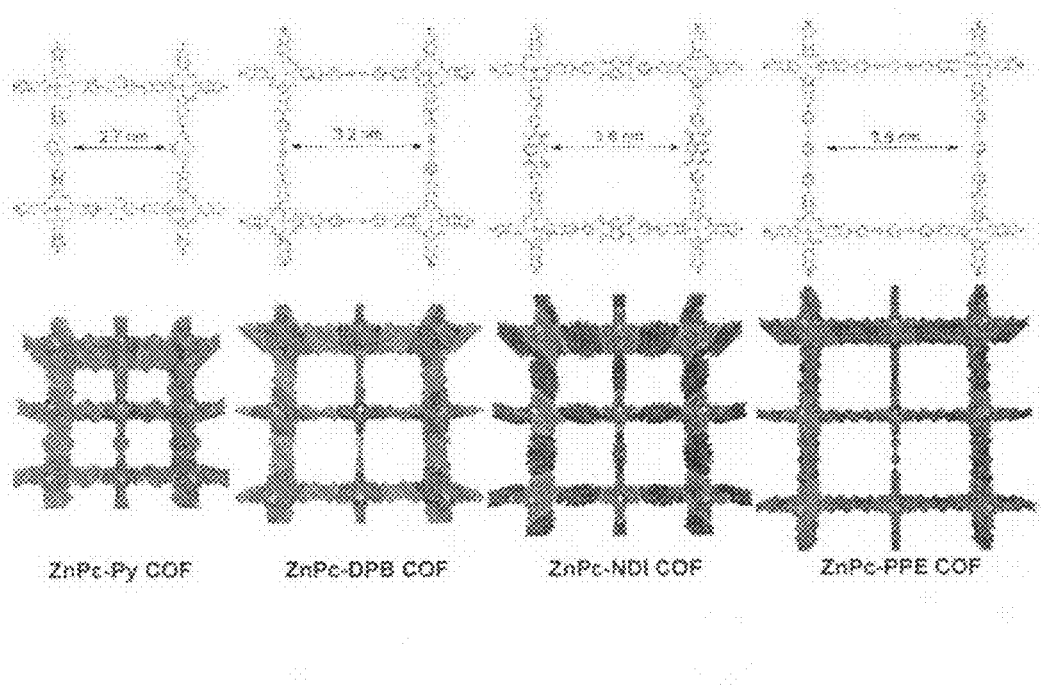
FIG. 4. An example of expanded ZnPc COFs. Each COF forms a two-dimensional layered network containing zinc phthalocyanines joined by (left to right) pyrene, diphenylbutadiyne, naphthalenediimide and phenylbis(phenylethynyl) units.

The present invention provides, for example, four Zn phthalocyanine-containing COFs with progressively increasing pore size (e.g., 2.7, 3.2, 3.6, and 3.8 nm as shown in FIG. 4), which is well into the mesoporous regime, by incorporating long linkers. Vertically oriented films of these COFs can be grown on transparent substrates functionalized with single layer graphene. In an example, the film shows unprecedented crystallinity and nearly perfect vertical alignment (i.e., nearly zero mosaic spread).

In an aspect the present invention provides multilayer structures comprising a COF layers on a polyaromatic carbon (PAC) layer or PAC layers. The PAC layer or PAC layers are supported on substrates.

In an embodiment, the present invention provides a COF layer in contact with a PAC layer having a first side and a second side, wherein the PAC layer is in contact with a substrate, such that the COF is in contact with a first side of the PAC layer and the substrate is in contact with a second side of the PAC layer. In an embodiment, the PAC layer is graphene or graphite. In an embodiment, the substrate is a copper, copper-coated silicon, fused silica, sapphire, or silicon carbide. In an embodiment, the COF layer comprises COF-5, TP-COF, NiPc-PBBA COF, ZnPc-Py COF, ZnPc-DPB COF, ZnPc-NDI COF, or ZnPc-PPE COF. In an embodiment, the COF layer has a thickness of 5 nm to 1 micron. In an embodiment, the pores of the COF layer have a diameter of 1 nm to 6 nm. In an embodiment, the COF layer has an average grain size of at least 5 unit cells. In an embodiment, the COF layer comprises at least 3 molecular layers, and wherein there is no detectable stacking fault.

The COF layer (i.e., film) is a one or more two-dimensional (2-D) COFs. A COF layer can be a single 2-D COF or a plurality of stacked 2-D COFs. The 2-D layers are covalently bound networks and the 2-D layers are associated with each other in the vertical direction (i.e., a third dimension) by non-covalent interactions. A variety of suitable 2-D COFs are known in the art. Examples of suitable 2-D COFs include COF-5 and TP-COF, where these COFs have the following of these COFs having the structures:

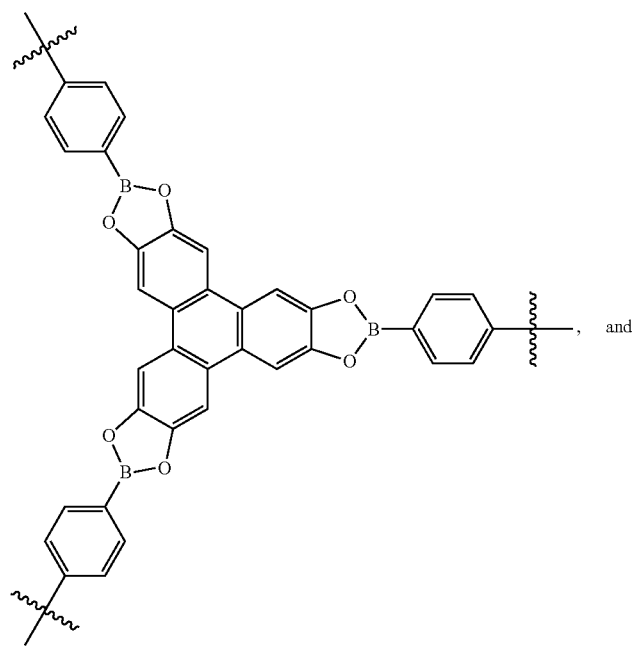

-continued
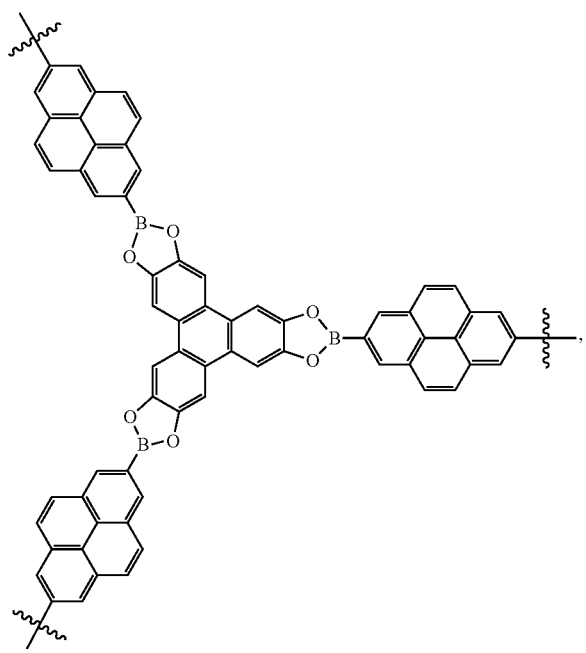
respectively. Additional examples of suitable COFs include: NiPc-PBBA COF, ZnPc-Py COF, ZnPc-DPB COF, ZnPc-NDI COF, or ZnPc-PPE COF having the structures:
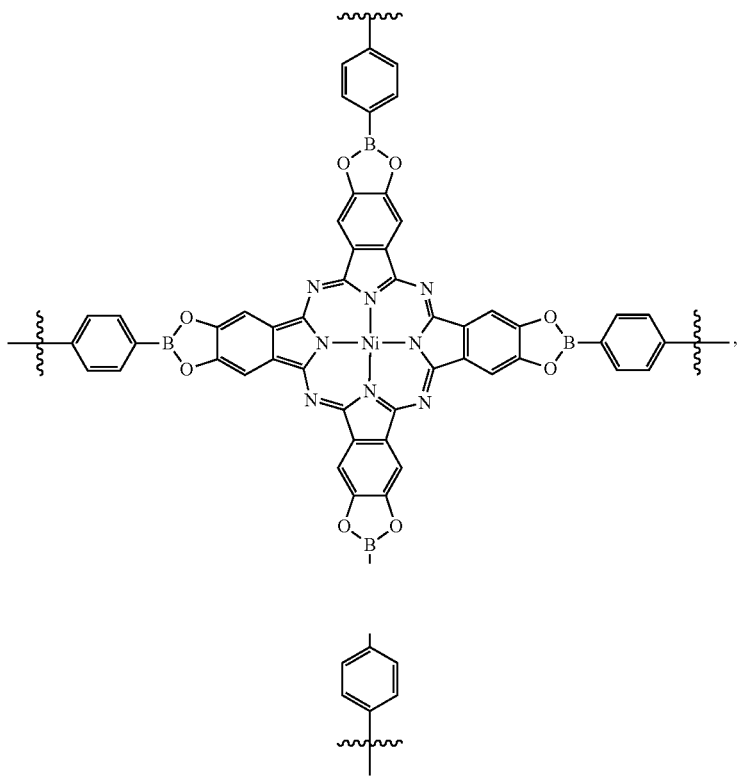

-continued
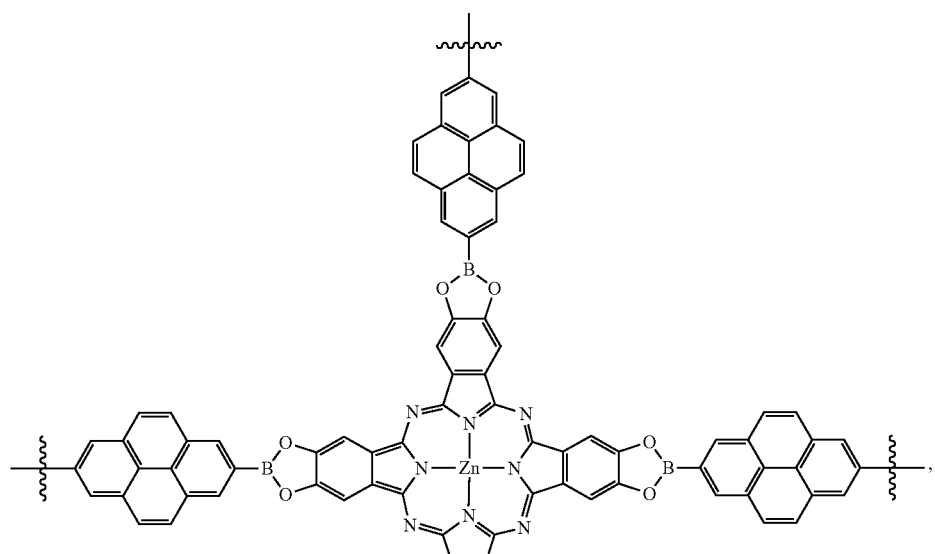
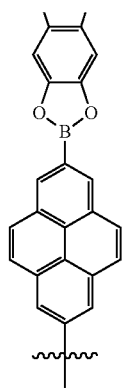

-continued
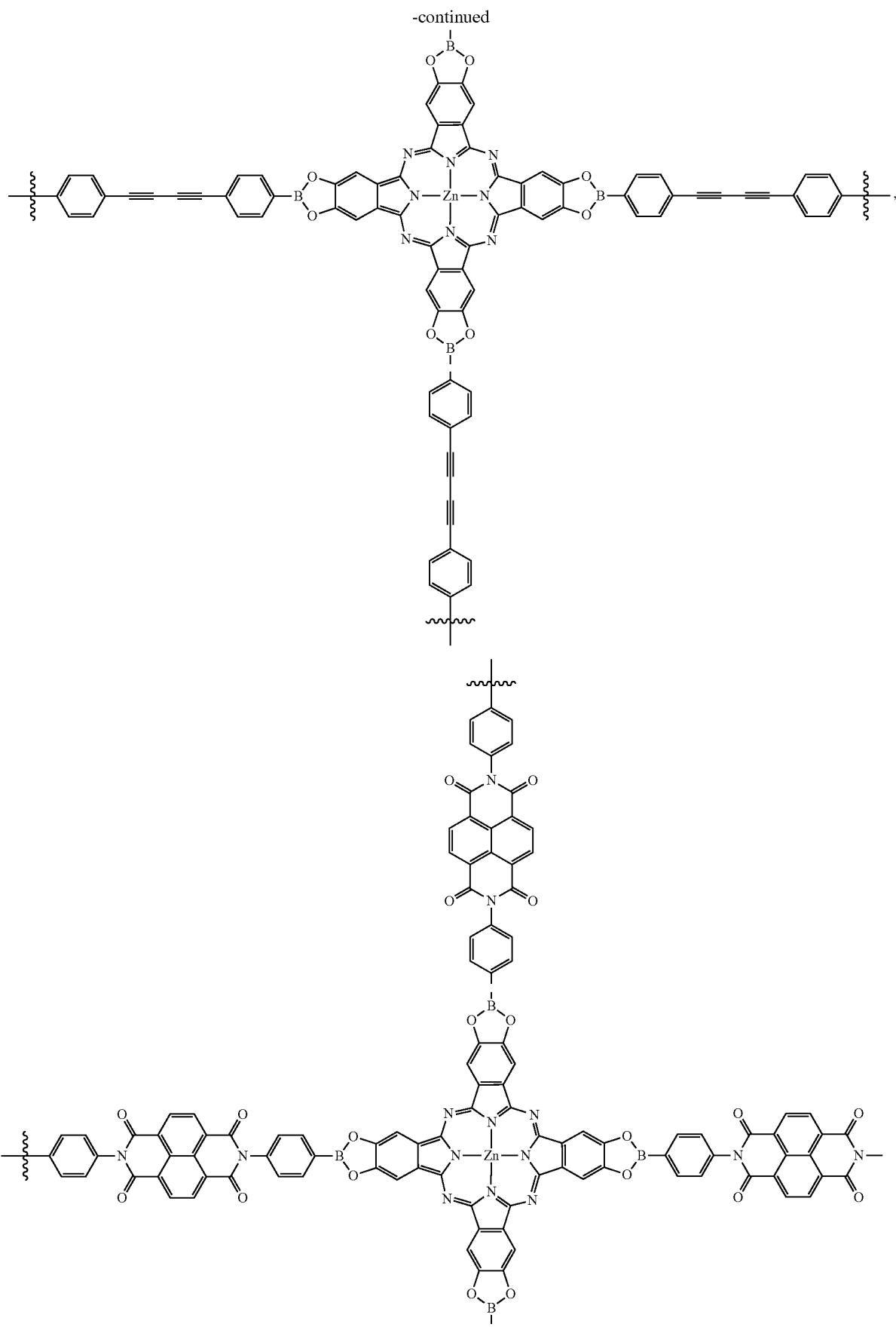

-continued
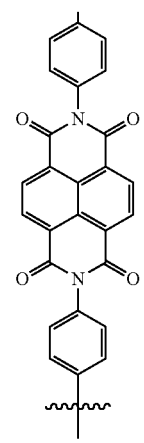
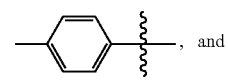, and
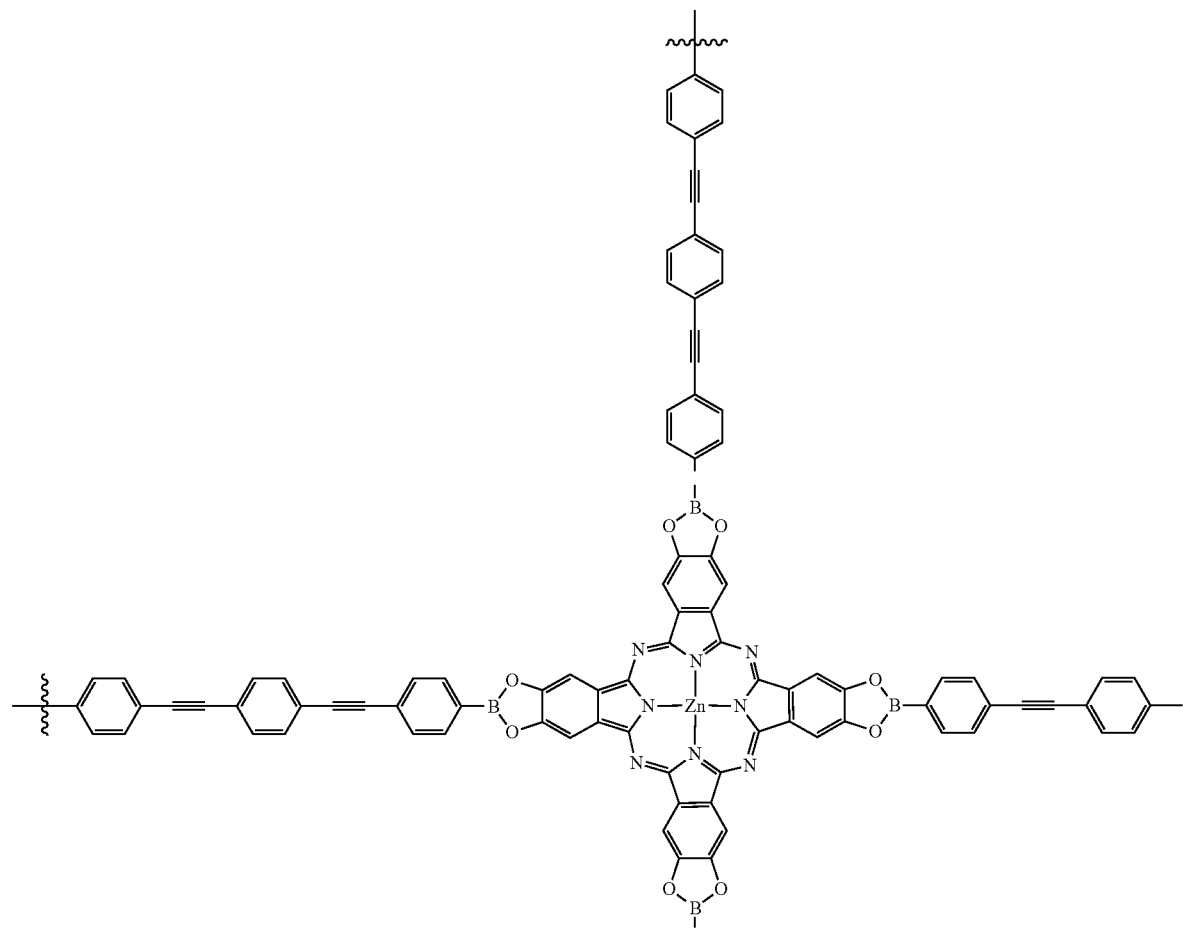

-continued

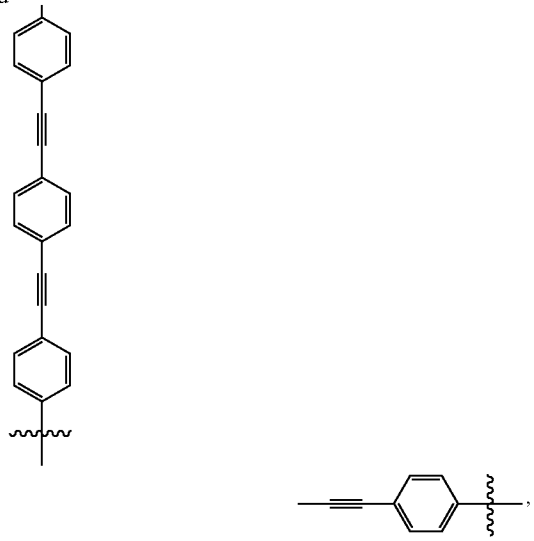

respectively.

The COF layer is a thin COF film. The COF film can have a thickness of 5 nm to 1 micron, including all values to the nm and ranges therebetween.

The COF layers have a periodic structure. For example, the COF comprises a plurality of secondary building units (SBUs) assembled to form a periodic and porous framework. A SBU comprises a plurality of subunit groups connected by a multifunctional linker group (MFLG), and at least three of the subunit groups are each connected to a multifunctional linker group by covaltent bond(s). For example, the subunit groups and multifunctional linker groups are connected by at least one covalent bond. In other examples, the subunit groups and multifunctional linker groups are connected by one covalent bond, two covalent bonds, or three covalent bonds. The subunit groups and multifunctional linker groups can be connected by, for example, carbon-boron bonds, carbon-nitrogen bonds (e.g., an imine bond or a hydrazone bond), carbon-oxygen bonds, carbon-carbon bonds, or boron-oxygen bonds (e.g., boronate ester bonds). Examples of COF structures include:

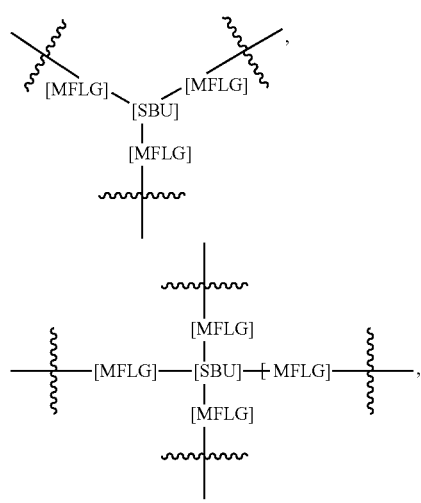

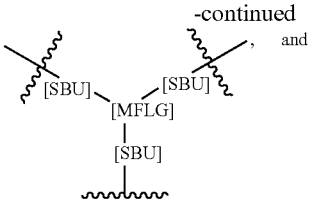

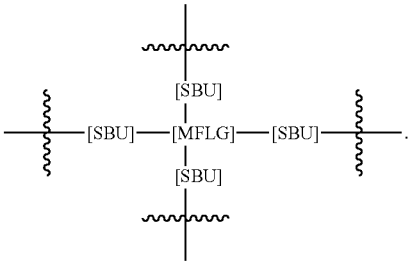

In an embodiment, the subunit groups are comprised of a substituted or unsubstituted aryl moiety. For example, the subunit group is a catechol subunit group. The catechol subunit groups may be substituted or unsubstituted. The catechol subunit group comprises an aryl moiety and at least two catechol moieties. The aryl moiety comprises at least one conjugated moiety, where a plurality of the atoms of the aryl moiety is conjugated (e.g., form a conjugated π system). The aryl moiety can, for example, comprise an aromatic cyclic hydrocarbon, aromatic cyclic heterocycle, or a hydrocarbon or heteroatom-containing macrocycle. The aryl moiety and catechol moieties of a subunit can be distinct (i.e., separate) structures or can have common atoms (i.e., share structural elements) within the catechol subunit. In an embodiment, the catechol subunit comprises 2 to 6 catechol moieties. In an embodiment, the aryl moiety is a phthalocyanine. An example of a catechol subunit is an unsubstituted phthalocyanine catechol subunit having the following structure:

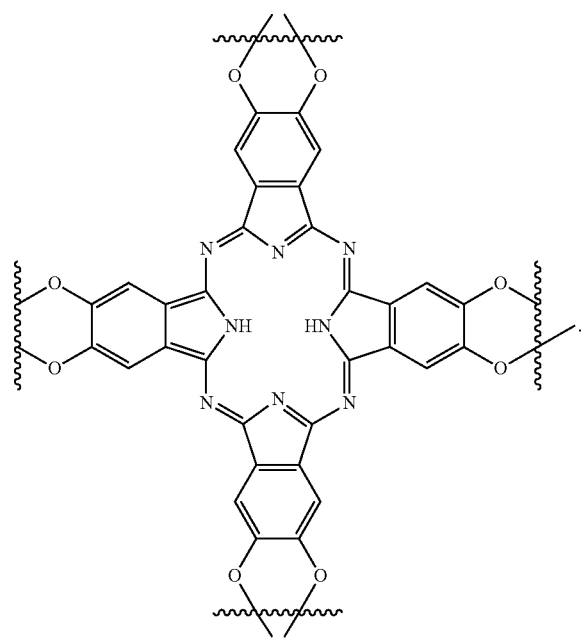

In another embodiment, the aryl moiety is a hexahydroxytriphenylene. An example of a catechol subunit is an unsubstituted hexahydroxytriphenylene subunit having the following structure:

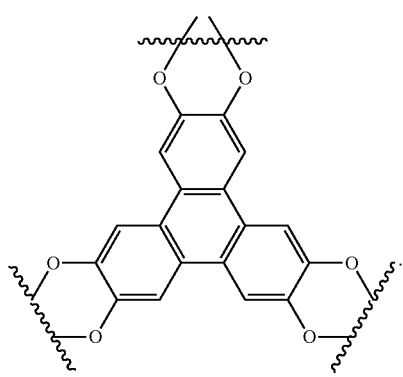

In an embodiment, the catechol subunit is a substituted or unsubstituted phthalocyanine subunit. In this embodiment, the substituted or unsubstituted phthalocyanine subunit, where the phthalocyanine moiety is present as a free base or as an anion (e.g., a dianion), can further comprise a metal. An example of an unsubstituted phthalocyanine subunit comprising a metal ion is shown in the following structure:

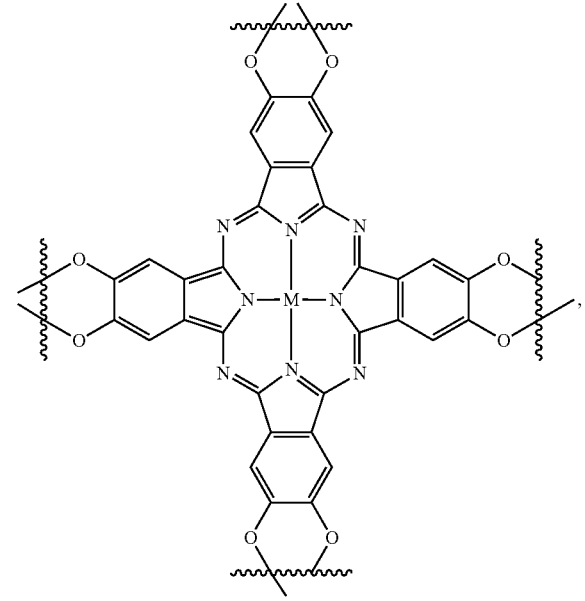

where M is a metal atom or ion.

In an embodiment, the subunit group (e.g., phthalocyanine catechol subunit group) comprises a metal (e.g., a metal atom or a metal ion). The metal is chemically bonded to the subunit. It is expected that any metal atom or metal ion can be incorporated in a subunit group. Examples of suitable metals include, but are not limited to, Zn, Ni, Cu, Co, Lu, Tc, Tb, and the like.

The multifunctional linking groups are comprised of one or more different types of atoms chosen from: carbon, hydrogen, nitrogen, sulfur, boron, oxygen and combinations thereof. In an embodiment, the multifunctional linking groups are comprised of at least two different types of atoms chosen from: carbon, hydrogen, nitrogen, sulfur, boron, oxygen and combinations thereof. A multifunctional linking group can be formed from a multifunctional linker. It is desirable that the multifunctional linking group be rigid such that covalent bonds between the subunits and multifunctional linking groups have the appropriate geometry resulting in a crystalline structure. For example, the multifunctional linker can comprise, or optionally consist of, a $sp^1$ or $sp^2$ hybridized or $sp^2$-like hybridized network of atoms mentioned above. The multifunctional linking group can comprise any group with a rigid structure such as, for example, an aryl group, a non-aromatic polycyclic group (e.g., an adamantane group) and the like.

For example, the multifunctional linking group comprises boron and joins at least two catechol subunit groups via covalent bond (e.g., boronate ester bonds) between the subunits and the linking group. In an embodiment, the multifunctional linking group is a bifunctional linking group with the following structure:

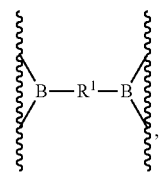

where $R^1$ is a substituted or unsubstituted aryl group comprising 5 to 50 carbons, including all integer number of carbons and ranges of number of carbons therebetween. The aryl moiety comprises at least one conjugated moiety, which comprises a number of atoms which are conjugated (e.g., form a conjugated π system). The aryl moiety can, for example, comprise an aromatic cyclic hydrocarbon, aromatic cyclic heterocycle, or a hydrocarbon or heteroatom-containing macrocycle. Examples of multifunctional linking groups include, but are not limited to, the following structures:

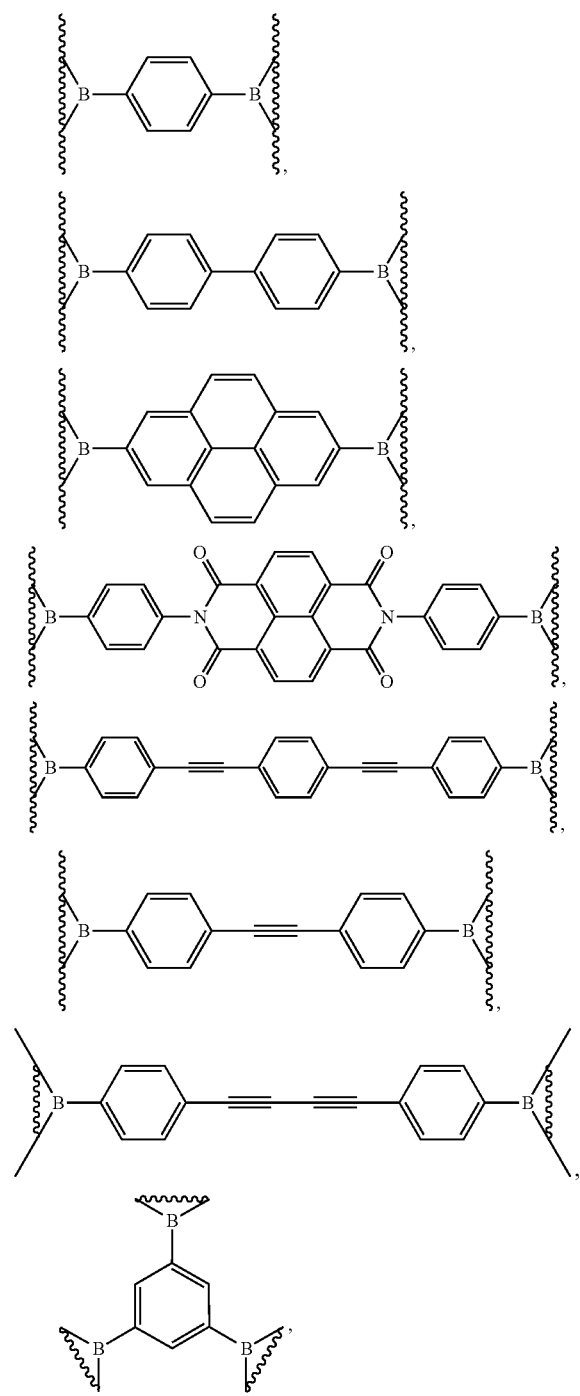

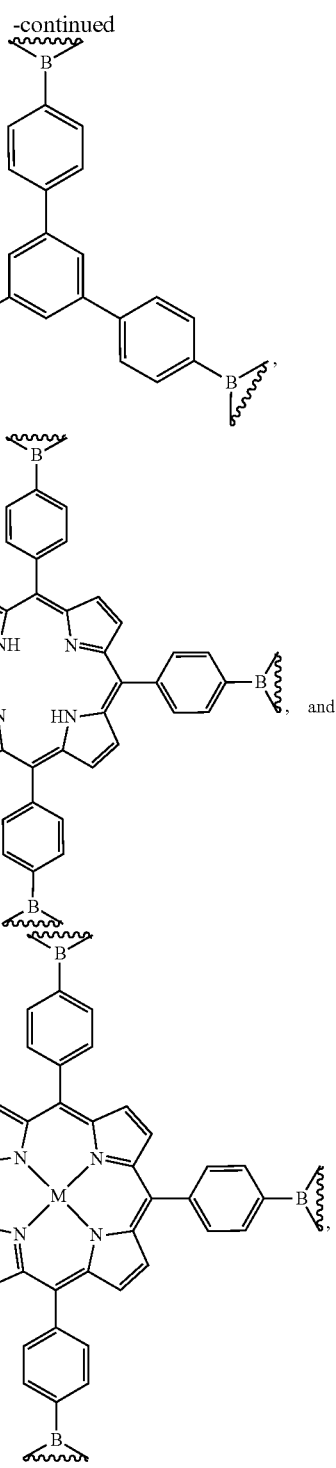

where M is metal atom or metal ion, and the like.

In an embodiment, the multifunctional linking group comprises a metal (e.g., metal atom or a metal ion). The metal is chemically bonded to the multifunctional linking group. It is expected that any metal atom or metal ion can be incorporated in a multifunctional linking group. Examples of suitable metals include, but are not limited to, Zn, Ni, Cu, Co, Lu, Tc, Tb, and the like.

The COF layer is porous (e.g., microporous (pores with a longest dimension of less than 2 nm) or mesoporous structure (pores with a longest dimension of 2 nm to 50 nm)). The porous structure has pores forming a repeating pattern (i.e., not a random distribution of pores) based at least in part on the structure of the subunit structure and the multifunctional linker structure that make up the COF. The pores are perpendicular to the PAC layer. In an embodiment, the pores have a longest dimension (e.g., a diameter) of from 1 nm to 6 nm, including all values to the 0.5 nm and ranges therebetween.

The COF layer is crystalline. For example, the crystallinity of the COF layer can be measured by the grain size of the grains (i.e., crystallite domains) making up the COF layer. The grain size of the COF layer can be from 50 nm to 10 microns, including all values to the nanometer and ranges of nanometers therebetween. The grain size can also be measured by the number of unit cells in the grain. In various embodiments, the average grain size is at least 5 unit cells, at least 10 unit cells, at least 50 unit cell, at least 100 unit cells, at least 200 unit cells, at least 300, at least 400, or at least 500 unit cells.

The COF layers are made up of a various number of 2-D COF layers. In various embodiments, the COFs have at least one, at least two, at least 5, at least 10, at least 25, at least 50, at least 100, at least 200, at least 300, or at least 400 2-D COF layers.

It is desirable to have the layers in film overlaid such that the free space of one layer coincides with the free space of the layers above and below it, thus forming linear porous channels with the layer(s) next to it. This indexing of layers is referred to as orientation. It is desirable to have an oriented film. Another measure of orientation is mosaicity of the film. Mosaicity refers to the range of tilt values of the crystal grains in the film. For example, 13 degrees mosaicity means that most crystallites have a tilt angle between 0 and 13 degrees. In various embodiments, the mosaicity ranges from 0 to 13, including all values to the degree and ranges therebetween. The orientation of the film can be measured by x-ray diffraction.

The vertical orientation of the film may also be evaluated by the number of molecular layers present in the film without a detectible fault. An increase in the number of molecular layers present without a detectible fault is indicative of an increase in the orientation of the file. In various embodiments, the COF layer comprises at least 3 molecular layers, at least 10 molecular layers, at least 20 molecular layers, at least 30 molecular layers, at least 50 molecular layers, at least 100 molecular layers, at least 200 molecular layers, at least 300, at least 400, least 500 molecular layers, or at least 1000 molecular layers, where there is no detectable stacking fault. The presence of stacking faults can be measured by analytical techniques known in the art such as x-ray diffraction or microscopy (e.g., scanning electron microscopy (SEM) or transmission electron microscopy (TEM)).

The contiguous area of the COF films can have a wide variety of shapes and broad ranges of areas. For example, contiguous areas of about 100 nm$^2$ and several square feet can be formed. In various embodiments, the contiguous area of the COF films can be 1 cm$^2$ or less to 30 cm$^2$ or more and have any shape.

The COF films can have high surface area. For examples, the COF layer can have a surface area 500 m$^2$/g to 2500 m$^2$/g, including all values to the m$^2$/g and ranges of surface area therebetween. The surface area of the COF layer can be determined by methods known in the art, for example, by BET analysis of gas (e.g., nitrogen) adsorption isotherms.

The COF films can exhibit desirable properties. For example, COF layers can absorb light having a wavelength of from 200 nm to 1500 nm, including all values to the nanometer and ranges of nanometers therebetween. As another example, COF layers can be semiconductors (e.g., exhibit semiconducting properties). As another example, COF layers are thermally stable at temperatures of from 20° C. to 500° C., including all values to the degree Celsius and ranges of degrees Celsius therebetween.

The COF layer is in contact with a PAC layer. In various embodiments, the surface coverage of the PAC layer by the COF layer is at least 50, 60, 70, 80, 90, 95, 99, 99.5 or 100 percent, including all values to the percent and ranges therebetween.

The PAC layer is a planar sheet or planar sheets of aromatic rings made up of sp$^2$-bonded carbon atoms. Graphene has a single such layer. Graphite has multiple such layers. For example, the PAC layer can be a graphene layer (e.g., a single layer of graphene or graphite.

In an embodiment, the PAC layer is graphene. Graphene layers can be fabricated by methods known in the art. For example, a graphene layer can be formed on a metal or metal-coated substrate. Examples of suitable metals include copper and nickel. The COF layer can be formed on graphene layer, which is in contact with the metal or metal-coated substrate or can be transferred to another substrate, such as a non-metal substrate.

The substrate can be any substrate that can support the PAC layer. The substrate can be any size or thickness that can support the PAC layer. For some uses, it may be desirable that the substrate be transparent (e.g., transmit electromagnetic radiation in the solar spectrum). Examples of suitable substrates include metal substrates, metal-coated substrates, or non-metal substrates. Examples of suitable metal substrates include copper or nickel substrates. Examples of suitable metal-coated substrates include copper-coated, nickel-coated, and platinum-coated substrates, where the coated substrates are, for example, silicon, silicon dioxide (e.g, fused silica), or indium-tin-oxide (ITO) substrates. The substrates can also be non-metal substrates such as silicon, silicon dioxide (e.g, fused silica), or indium-tin-oxide (ITO) substrates.

Additional examples of substrates include, graphene supported polycrystalline copper (Cu) films (SLG/Cu), graphene supported fused silica (SiO$_2$) substrate material (SLG/SiO$_2$), graphene supported silicon (Si) substrate material (SLG/Si), graphene supported sapphire (S) substrate material [SLG/S], and silicon carbide (SiC) substrate material (SLG/SiC).

In an embodiment, the COF layer is patterned. For example, only the desired portions of the substrate are covered by the COF layer. The desired portion of the substrate can be any portion of the substrate. For example, a patterned COF layer can be formed by forming the PAC layer only on the portions of the substrate where it is desired that the COF/PAC layer be formed on the substrate. The substrate can be patterned by methods known in the art, such as, for example, photolithographic methods.

In an embodiment, the substrate can be patterned, such that only the desired portions of the substrate are covered by the COF/PAC layer. The desired portion of the substrate can be any portion of the substrate. The substrate can be patterned by methods known in the art, such as, for example, photolithographic methods. For example, the PAC layer can be formed only on the portions of the substrate where it is desired that the COF/PAC layer be formed.

In another embodiment, the substrate can be part of a larger or more complex device. For example, the COF/PAC layer can be integrated into a structure on, for example, a silicon chip or photovoltaic device.

In another aspect, the present invention provides methods for forming multilayer structures comprising a COF layer on a PAC layer or PAC layers. In an embodiment, the present invention provides multilayer structures comprising a COF layer on a PAC layer or PAC layers made by a method of the present invention.

In an embodiment, the present invention provides a method for forming a COF layer in contact with a PAC layer having a first side and a second side, wherein the PAC layer is in contact with a substrate, such that the COF is in contact with a first side of the PAC layer and the substrate is in contact with a second side of the PAC layer comprising the step of: contacting a subunit compound with a multifunctional linker compound in the presence of a PAC layer, where the PAC layer is in contact with a substrate, and a solvent, under conditions such that at least two subunits are connected to a multifunctional liker by at least one covalent bond and a COF layer is formed on the PAC layer. Without intending to be bound by any particular theory, it is considered that the PAC layer or PAC layers templates in situ COF film formation from the subunit compound and the multifunctional linker compound.

In an embodiment, the PAC layer is graphene or graphite. In an embodiment, the COF layer has at least one covalent bond selected from an imine bond, a hydrazone bond, a triazine bond and a boronate ester bond. In an embodiment, the subunit compound comprises at least two catechol moieties and the multifunctional linker compound comprises at least two boronic acid moieties.

The subunit compounds are comprised of a substituted or unsubstituted aryl moiety that is substituted with at least one functional group that can react with a multifunctional linker compound to form at least one covalent bond. The aryl moiety comprises at least one conjugated moiety, where a plurality of the atoms of the aryl moiety is conjugated (e.g., form a conjugated π system). For example, the aryl moiety can have one phenyl ring, at least two phenyl rings, at least three phenyl rings, or at least four phenyl rings. Where the aryl moiety has a plurality of phenyl rings the phenyl rings can have, for example, a fused ring structure, individual rings can be linked by a single C—C bond (e.g., a biphenyl-like structure) or a combination thereof. The catechol subunits may be substituted or unsubstituted. In an embodiment, the subunit compound comprises a metal atom. Examples of suitable metals include Zn, Ni, Cu, Co, Lu, Tc, Tb, and the like.

For example, the subunit compound comprises an aryl moiety and at least two catechol moieties (i.e., a 1,2-dihydroxybenzene). The aryl moiety can, for example, comprise an aromatic cyclic hydrocarbon, aromatic cyclic heterocycle, or a hydrocarbon or heteroatom-containing macrocycle. The aryl moiety and catechol moieties of a subunit compound can be distinct (i.e., separate) structures or can have common atoms (i.e., share structural elements) within the catechol subunit. In an embodiment, the catechol subunit comprises 2 to 6 catechol moieties.

Examples of such subunit compounds include the following structures:

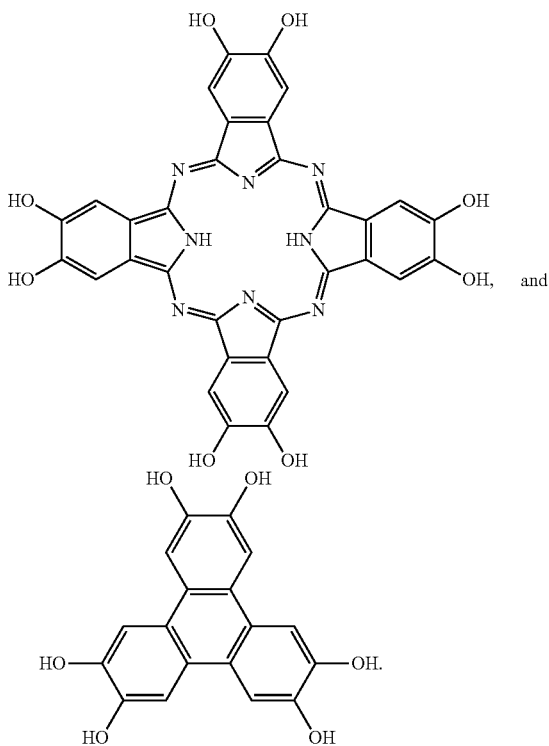

In an embodiment, the subunit compound comprises a metal (e.g., metal atom or ion). The metal is chemically bonded to the subunit. It is expected that any metal atom or metal ion can be incorporated in a subunit compound. Examples of suitable metals include, but are not limited to Zn, Ni, Cu, Co, Lu, Tc, Tb, and the like. Example of such a subunit includes the following structure:

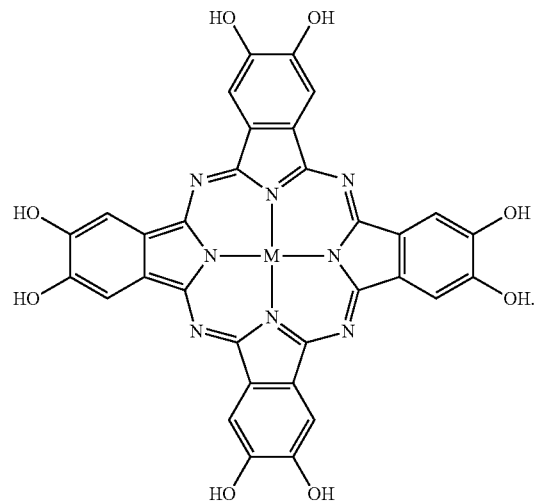

The multifunctional linking compounds are comprised of at least two different types of atoms chosen from: carbon, hydrogen, nitrogen, sulfur, boron, oxygen and combinations thereof. A multifunctional linking group can be formed from a multifunctional linker compound. For example, a multifunctional linker compound comprises a functional group or functional groups that when reacted with a subunit compound can form at least one covalent bond. Examples of such bonds include boronate ester bonds, imine bonds, hydrazine bonds, and triazene bonds. It is desirable that the multifunctional linking compounds be rigid such that covalent bonds formed between the subunit compounds and multifunctional linking compounds have the appropriate geometry which results in a crystalline structure. For example, the multifunctional linker compound can comprise, or optionally exclusively comprise, a $sp^1$ or $sp^2$ hybridized or $sp^2$-like hybridized network of atoms mentioned above. The multifunctional linking compound can comprise any group with a rigid structure such as, for example, an aryl moiety, a non-aromatic polycyclic moiety (e.g., an adamantane moiety) and the like.

For example, a multifunctional linker compound is a compound comprising a substituted or unsubstituted aryl moiety and has at least one boronic acid group that can react with a catechol subunit to form at least one boronate ester bond. The aryl moiety comprises at least one conjugated moiety, a number of atoms which are conjugated (e.g., form a conjugated π system). The aryl moiety can, for example, comprise an aromatic cyclic hydrocarbon, aromatic cyclic heterocycle, or a hydrocarbon or heteroatom-containing macrocycle. In an embodiment, the multifunctional linker is a compound with two boronic acid groups. In an embodiment, the multifunctional linker has the following formula:

$$(HO)_2B-R^1-B(OH)_2,$$

where $R^1$ is an aryl group or a polycyclic non-aromatic group (e.g., an adamantine group). In an embodiment, the boronic acid group reacts with an adjacent catechol group(s) on a subunit to form a boronate ester bond. It is desirable that the multifunctional linker be rigid such that covalent bonds formed between the subunits and multifunctional linking groups have the appropriate geometry resulting in a crystalline structure. The multifunctional linker can comprise any group with a rigid structure such as, for example, an aryl group, a non-aromatic polycyclic group (e.g., an adamantine group) and the like.

Examples of multifunctional linkers include, but are not limited to, the following compounds:

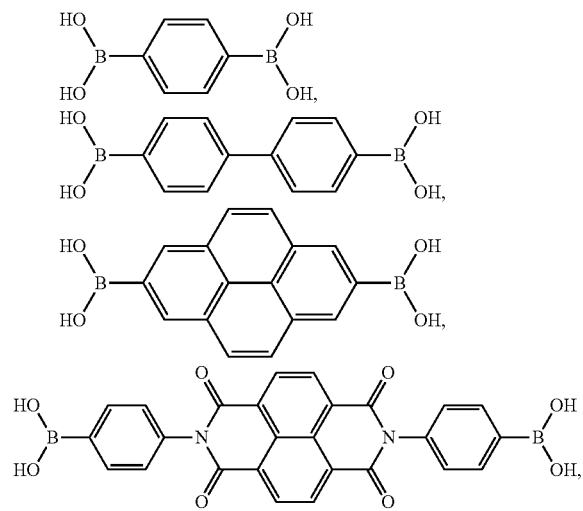

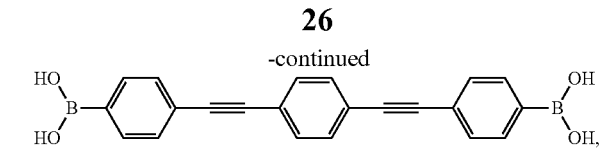

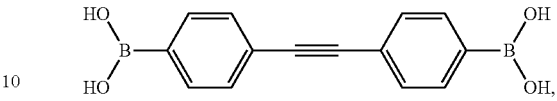

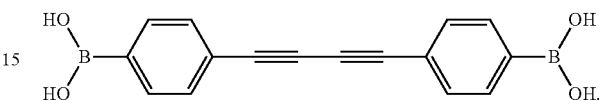

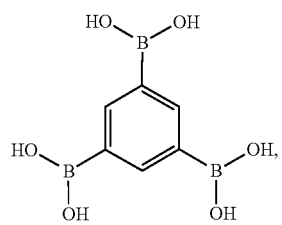

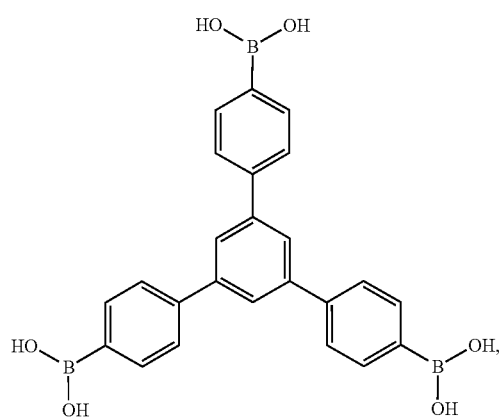

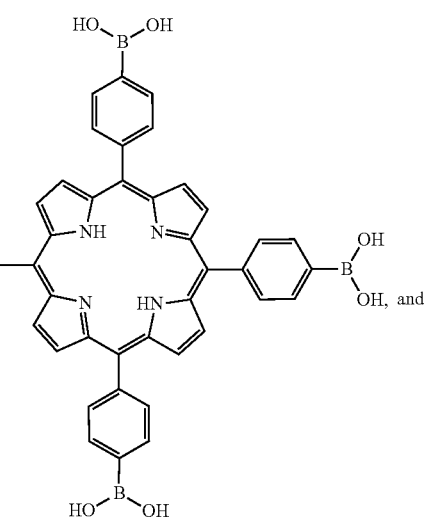

-continued

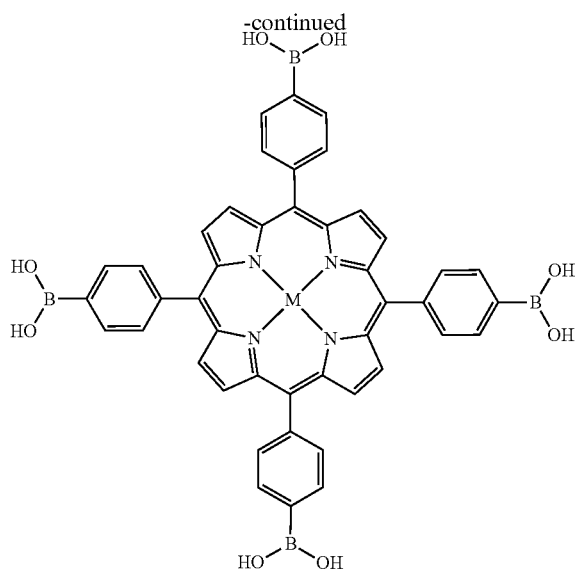

where M is a metal atom or ion, and the like.

In an embodiment, the multifunctional linking group comprises a metal (e.g., metal atom or a metal ion). The metal is chemically bonded to the multifunctional linking group. It is expected that any metal atom or metal ion can be incorporated in a multifunctional linking group. Examples of suitable metals include, but are not limited to, Zn, Ni, Cu, Co, Lu, Tc, Tb, and the like.

Any solvent in which the reactants (e.g. subunit compound and multifunctional linker compound) have partial or complete solubility and reactivity can be used. A single solvent or combinations of such solvents can also be used. For example, mixtures of two, three, or four solvents can be used. It is desirable to identify a suitable solvent or mixture of solvents which provides formation of a COF layer. It may also be desirable to identify a particular ratio of solvents in a mixture of solvents. Examples of suitable solvents include toluene, alcohols, chlorinated hydrocarbons, 1,2-dichlorobenzene, tetrahydrofuran, anisole, dioxane, mesitylene, dimethylacetamide, and the like, and mixtures thereof.

Reaction conditions/parameters can be important in preparing COF layers. Examples of such conditions/parameters include, but are not limited to, reaction, temperature, concentration of subunit compound, concentration of multifunctional linker, reaction atmosphere (e.g. argon, nitrogen, air, vacuum), reaction vessel (e.g. sealed or unsealed), reaction vessel size. The determination of suitable reaction conditions is within the purview of one having skill in the art.

In another aspect, the present invention provides uses of the multilayer structures described herein. For example, the COF layers can be incorporated in devices such as, for example, solar cells, flexible displays, lighting devices, RFID tags, sensors, photoreceptors, batteries, capacitors, gas-storage devices, gas-separation devices. In an embodiment, the present invention provides a device comprising a multilayer structure of the present invention or a multilayer structure made by a method of the present invention. In an embodiment, the device is selected from a solar cell, a flexible display, a lighting device, a RFID tag, a sensor, a photoreceptor, a battery, a capacitor, a gas-storage device, and a gas-separation devices. In another example, the COF layers can be used in drug delivery methods.

The following examples are presented to illustrate the present invention. They are not intended to limiting in any manner.

EXAMPLE 1

Figure 1:
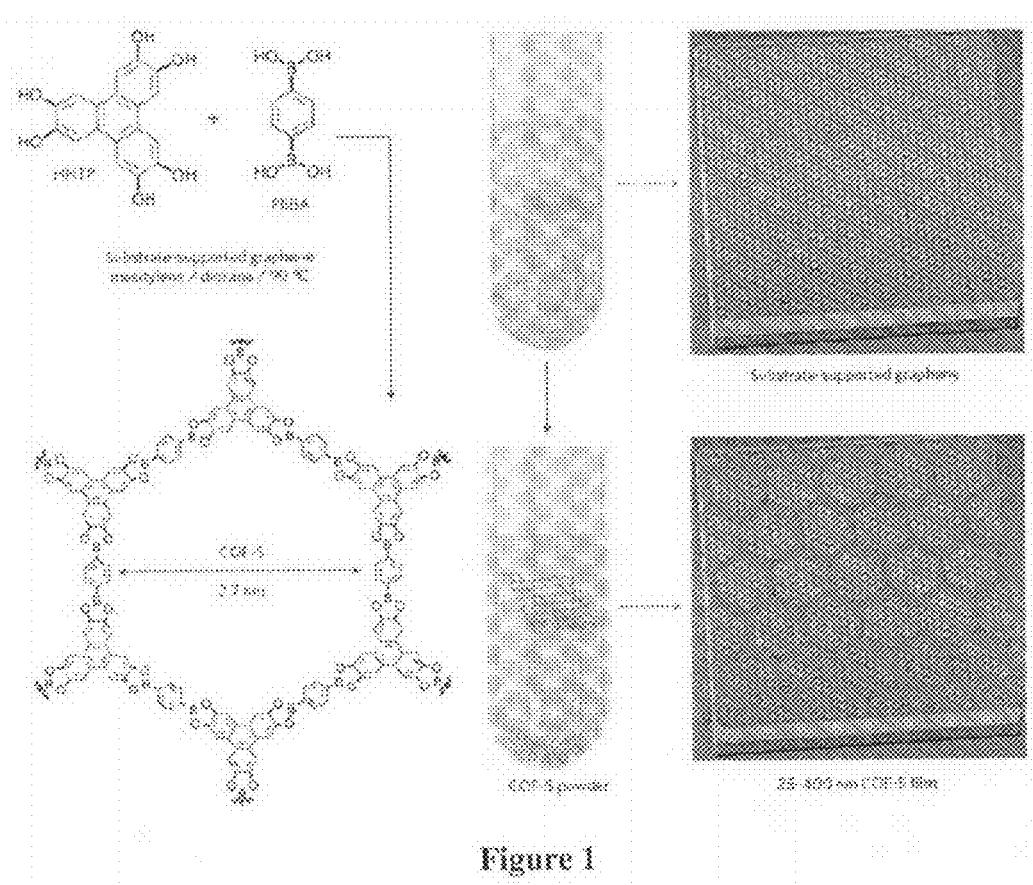
FIG. 1. An example of a method for preparing covalent organic framework 5 (COF-5) on single layer graphene (SLG).

The solvothermal condensation of 1,4-phenylenebis(boronic acid) (PBBA) and 2,3,6,7,10,11-hexahydroxytriphenylene (HHTP) in a mixture of mesitylene:dioxane (1:1 v/v) at 90° C. in the presence of SLG/Cu forms a framework known as COF-5 (FIG. 1), both as an insoluble powder and as a continuous film on the graphene surface. Powder x-ray diffraction (PXRD) and Fourier transform infrared spectroscopy (FTIR) of the unpurified powders indicated that crystalline COF-5 was obtained with only minor amounts of residual reactants in as little as 1 hour (FIG. 10), faster than the 72 hour reaction time used for its discovery.

The crystallinity of the COF-5 films and powders was compared using synchrotron X-ray diffraction. FIGS. 2A and 2B show 2-D X-ray diffraction patterns obtained from a powder sample and a film grown on SLG/Cu, respectively, using identical incident beam and scan parameters. The data in FIG. 2A were collected in transmission mode by suspending a ~0.1 mm thick powder sample perpendicular to the incident beam. The Bragg peaks in FIG. 2A appear as rings because of the random orientation of grains in the sample (see inset). FIG. 2B, as well as all subsequent diffraction data obtained from films, use grazing incidence diffraction (GID), in which the substrate surface is horizontal and nearly parallel to the incident beam. Axes labels $Q_\infty$ and $Q_\parallel$ are defined using the convention $Q_\infty = 4\pi/\lambda \sin(\delta/2)$ and $Q_\parallel = 4\pi/\lambda \sin(v/2)$, where $\delta$ and $v$ are the vertical and horizontal scattering angles, respectively. In contrast to FIG. 2A, the scattered intensity in FIG. 2B is concentrated near $Q_\infty = 0$, indicating that grains in the film exhibit fiber texture: their c-axis orientations are centered about the surface normal, but they are randomly rotated about this axis. Projections of these data sets near $Q_\infty = 0$ (FIG. 2C) indicate peaks from both samples at 0.24, 0.42, 0.48, 0.64, 0.84, and 0.88 Å$^{-1}$, corresponding to 100, 110, 200, 210, 220, and 310 Bragg peaks of a hexagonal lattice with a=b=29.9 Å, extremely close to the calculated (30.0 Å) and measured (29.7 Å) values previously reported for COF-5 powders. The concentration of these peaks near $Q_\infty = 0$ in the film show that the hexagonal lattice of the COF-5 grains is aligned parallel to the substrate surface.

Figure 11:
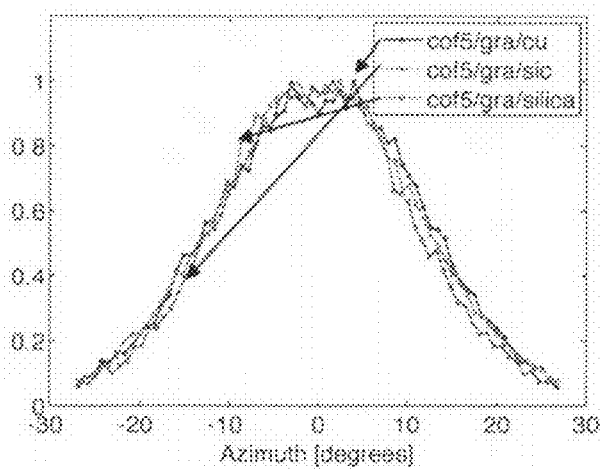
FIG. 11. Azimuthal intensity distribution of (001) Bragg peaks from three COF-5 films grown on different substrates, based on scans identical to that shown in FIG. 2D.
Figure 12:
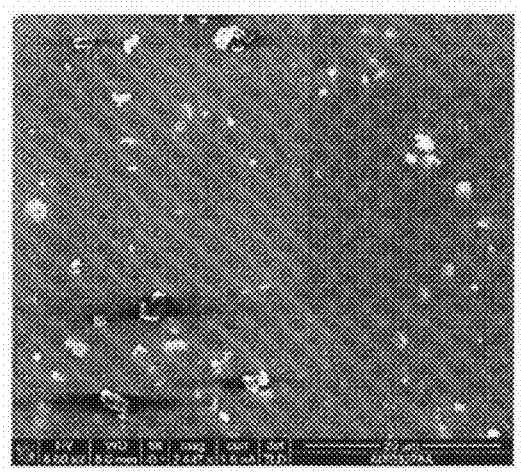
FIG. 12. Top-down SEM image of an example of a COF-5 film on SLG/Cu (growth time: 30 minutes).
Figure 13:
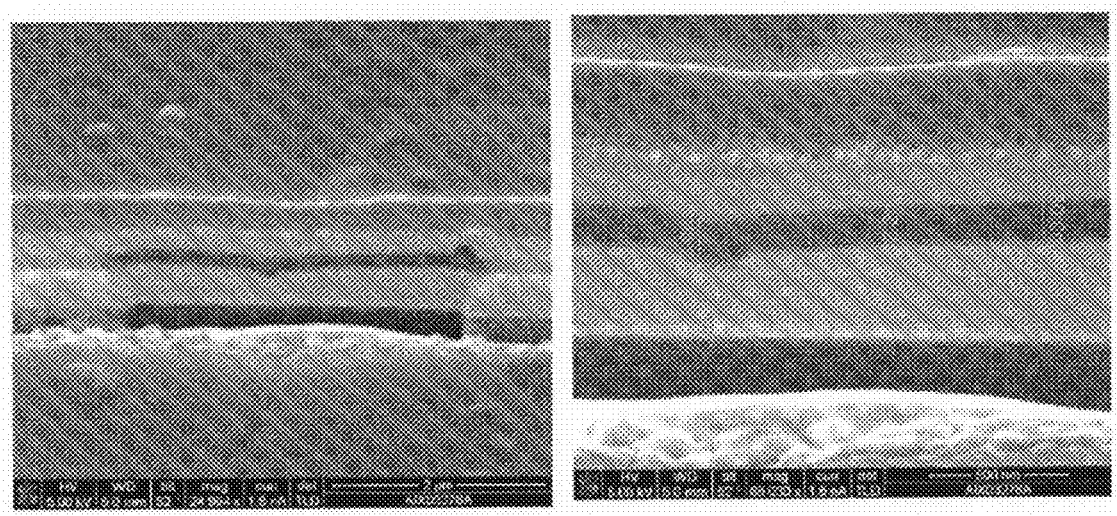
FIG. 13. Cross-sectional SEM image of examples of COF-5 films grown on SLG/Cu (growth time: 30 minutes). The film thickness was obtained by multiplying the measured values by 1.26. From top to bottom, the layers are Pt, COF-5 film, Cu, $SiO_2$, and Si.
Figure 14:
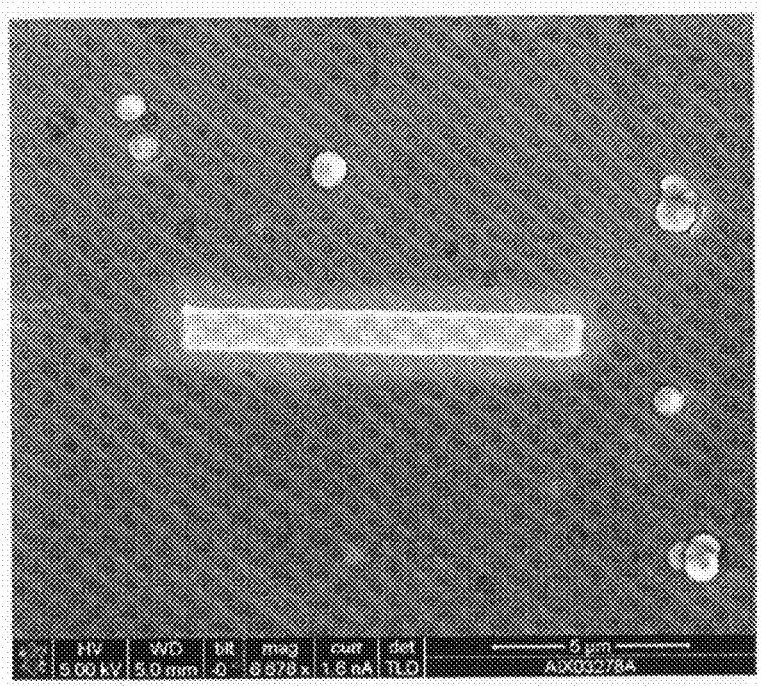
FIG. 14. Top-down SEM image of an example of a COF-5 film on SLG/Cu (growth time: 2 hours). The Pt bar (1 μm×10 μm) was deposited on top of the film prior to milling.
Figure 15:
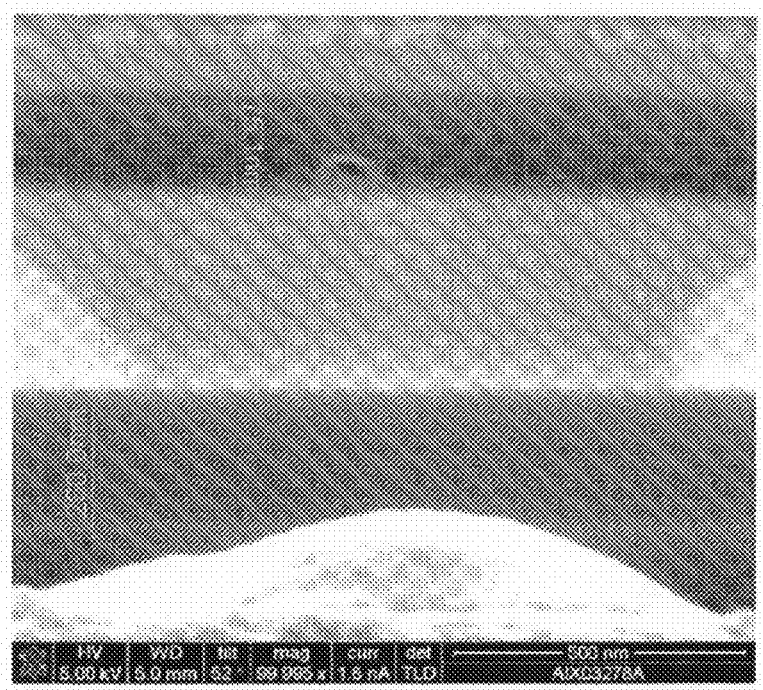
FIG. 15. Cross-sectional SEM image of examples of COF-5 film grown on SLG/Cu (growth time: 2 hours). The film thickness was obtained by multiplying the measured values by 1.26. From top to bottom, the layers are Pt, COF-5 film, Cu, and $SiO_2$.

FIG. 2C highlights additional peaks not shared by both samples. First, the film exhibits additional diffraction peaks at 0.97, 1.06, 1.21 and 1.27 Å$^{-1}$ that are not present in FIG. 2A or in reported PXRDs of COF-5 powder. These peaks correspond to the COF-5 400, 320, 500, and overlapping 330 and 420 Bragg peaks. Additionally, the 200 peak (at 0.48 Å$^{-1}$) is attenuated in the film compared to the powder. This difference can arise from trace impurities in the pores or from subtle differences in the horizontal offset between layers in the film compared to the powder. Powder rings in FIG. 2A at 1.27, 1.68, 1.87, and 1.94 Å$^{-1}$ correspond to Bragg peaks from residual starting materials trapped in the pores of the unpurified powder samples. The broad powder ring in FIG. 2A centered at 1.83 Å$^{-1}$ corresponds to the 001 Bragg peak, and indicates that the stacked COF-5 sheets are in van der Waals contact (c=3.43 Å). This peak is absent in FIG. 2B because the c-axes of grains in the film are oriented perpendicular to the substrate. Instead, the 001 peak of the film is observed (FIG. 2D) as a diffuse arc of scattering centered at $Q_\infty = 1.85$ Å$^{-1}$ by obtaining additional measurements near $Q_\parallel = 0$ and large out-of-plane diffraction angle, corresponding to large $Q_\infty$. The width of this peak in $Q_\parallel$ provides a rough measure of the orientational order in the film, and indicates that most grains orient their c-axes within ±13 degrees of the surface normal (FIG. 11). Debye-Scherrer analysis of FIGS. 2B and 2D, taking instrumental resolution into account and assuming platelet-shaped grains, indicates that the grains are ~6.8±0.3 nm tall×46±2 nm across, corresponding to approximately 20 unit cells laterally and vertically.

The coverage and thickness of the films on the SLG surface was evaluated by scanning electron microscopy (SEM). A top-down micrograph of a COF-5 film grown on SLG/Cu for 30 minutes (FIG. 2E) indicates complete coverage of the film over the graphene surface. A few bulk COF-5 crystallites are scattered on top of the film, which are observed in greater frequency when longer reaction times are used. They are not strongly associated to the underlying film, and most are removed by sonicating the substrate in dry toluene for 10 seconds, after which the micrographs are uniform over ~100 µm² areas. Grain boundaries in the COF film appear in the micrograph as thin dark lines that are attributed to the roughness of the underlying polycrystalline Cu layer as they are not observed when COF-5 is grown on SLG on smoother substrates (for additional representative micrographs, see FIG. 12-15). Cross-sectional micrographs were obtained after depositing a protective layer of Pt (400 nm) and milling the sample using a Ga⁺ focused ion beam (FIB). The cross-section of a film grown for 30 minutes (FIG. 3A) shows a continuous COF layer of 195±20 nm thickness, corresponding to approximately 580 layers. The GID of this sample (FIG. 3B) was identical to that obtained from the 2 hour film (FIG. 2B), indicating similar crystallinity and alignment. A discontinuity in the Cu is observed in FIG. 3A; though the structure of the graphene at this defect is not known, the COF film conforms to the indentation.

Figure 16:
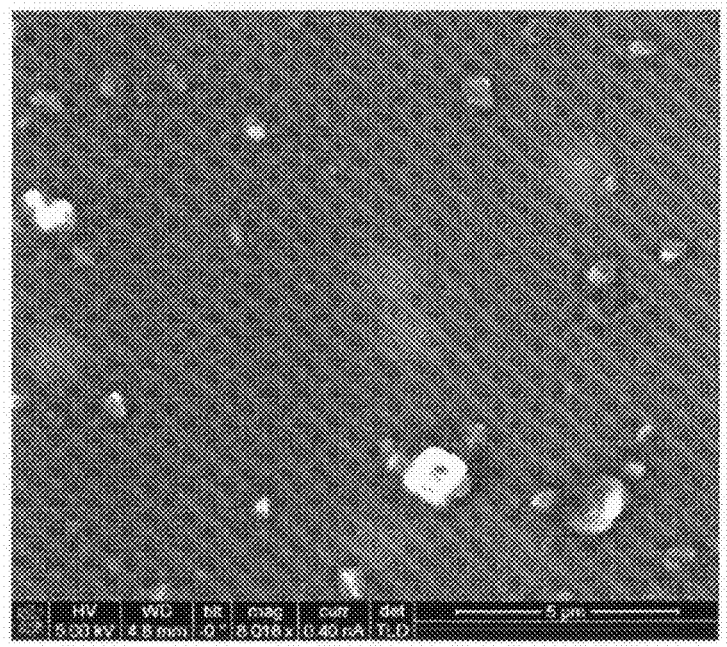
FIG. 16. Top-down SEM image of an example of a COF-5 film grown on $SLG/SiO_2$ (growth time: 2 hours).
Figure 17:
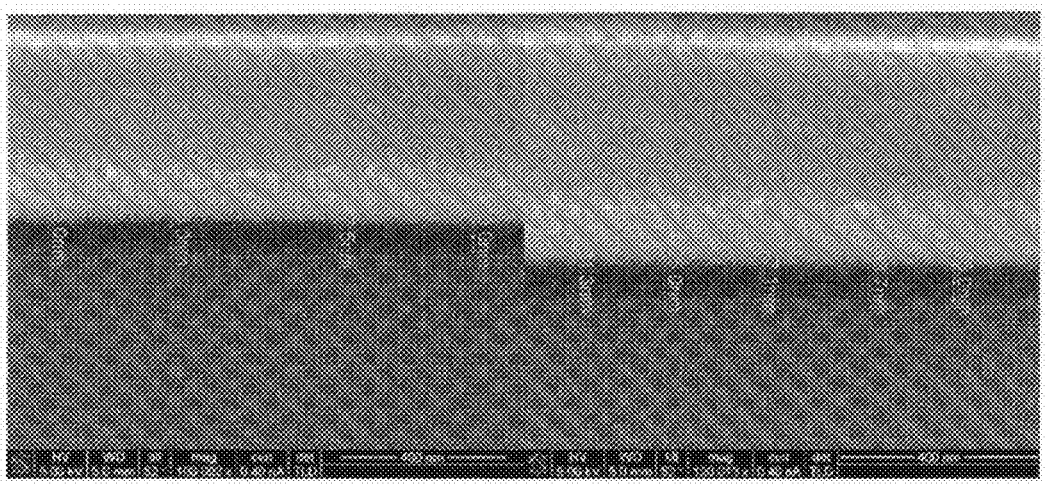
FIG. 17. Cross-sectional SEM images of examples of COF-5 films grown on $SLG/SiO_2$ (growth time: 2 hours). The film thickness was obtained by multiplying the measured values by 1.26. From top to bottom, the layers are Pt, COF-5 film, and $SiO_2$.

Although these studies were performed on SLG supported by its Cu growth metal, our synthetic method is general for SLG transferred to other substrates, including transparent fused $SiO_2$ (SLG/$SiO_2$). This flexibility facilitates studying the role of the underlying substrate on COF film growth, and provides a direct route for incorporating COFs into a wide range of devices. COF-5 shows similar structure and alignment on SLG/$SiO_2$ compared to SLG/Cu. The GID of a film (FIG. 3D, 2 hour reaction time) exhibits the same 100, 110, 200, 210, 220, 310, 400, 320, 330, 420, and 500 Bragg peaks with diffraction intensities all localized near $Q_\infty$=0. A cross-sectional micrograph (FIG. 3C) of the film obtained after FIB milling shows a COF-5 film thickness of 94±5 nm as well as a more uniform film/substrate interface compared to SLG/Cu. Top-down micrographs (FIG. 16) show fewer bulk crystallites and none of the cracks observed in the films grown on SLG/Cu. Films grown on SLG/Cu are consistently thicker than those grown on SLG/$SiO_2$ at equivalent reaction times (FIG. 17), suggesting that the Cu surface (including its defect sites) plays a role in COF nucleation. Since the graphene on each substrate is derived from the same CVD process, it was concluded that the thickness and uniformity of the film is strongly affected by the quality of the underlying substrate.

Figure 18:
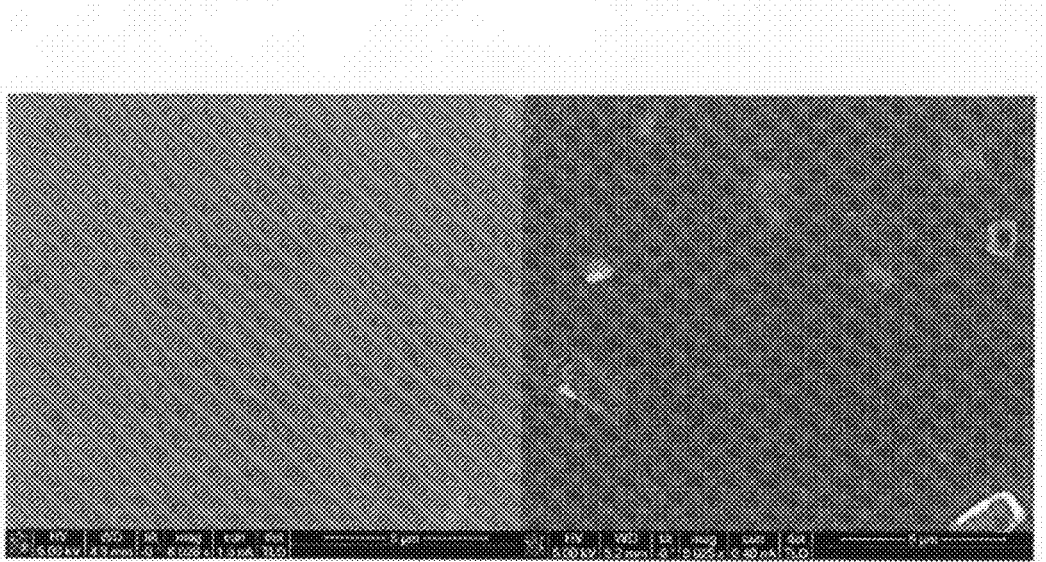
FIG. 18. Top-down SEM image of an example of a COF-5 film grown on SLG/SiC (growth time: 8 hours).
Figure 19:
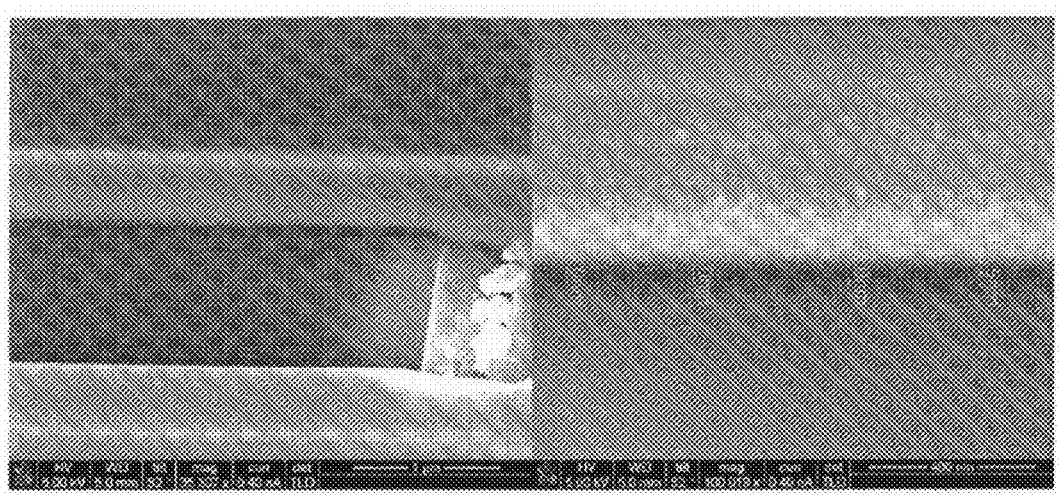
FIG. 19. Cross-sectional SEM images at different magnifications of examples of COF-5 films grown on SLG/SiC (growth time: 8 hours). The film thickness was obtained by multiplying the measured values by 1.26. From top to bottom, the layers are Pt, COF-5 film, and SiC.

COF-5 films also form on SLG derived from the thermal decomposition of SiC from its Si-terminated basal plane (SLG/SiC). SLG/SiC exhibits reduced surface roughness and larger graphene domains compared to SLG/Cu. Top-down micrographs of COF-5 films grown for 8 hours indicate the formation of continuous films with no visible grain boundaries and few bulk crystallites (FIG. 18). Cross-sectional micrographs obtained of FIB-milled samples indicate a uniform film with a thickness of 73±3 nm (FIGS. 3E and 19). The relatively thin COF film grown on SLG/SiC in 8 hours follows the thickness trend observed for SLG/Cu and SLG/$SiO_2$. GID of the film indicates similar diffraction patterns as those grown on the other substrates, suggesting a highly crystalline, vertically oriented film. The epitaxial relation between SLG and the single-crystal SiC substrate allowed us to determine that the COF-5 film does not grow epitaxially with respect to the graphene, as rotation of the sample during the GID experiment did not reflect the six-fold symmetry of the COF lattice. This finding suggests that matching the COF lattice size and symmetry to the underlying graphene is not necessary to obtain crystalline films.

Figure 9:
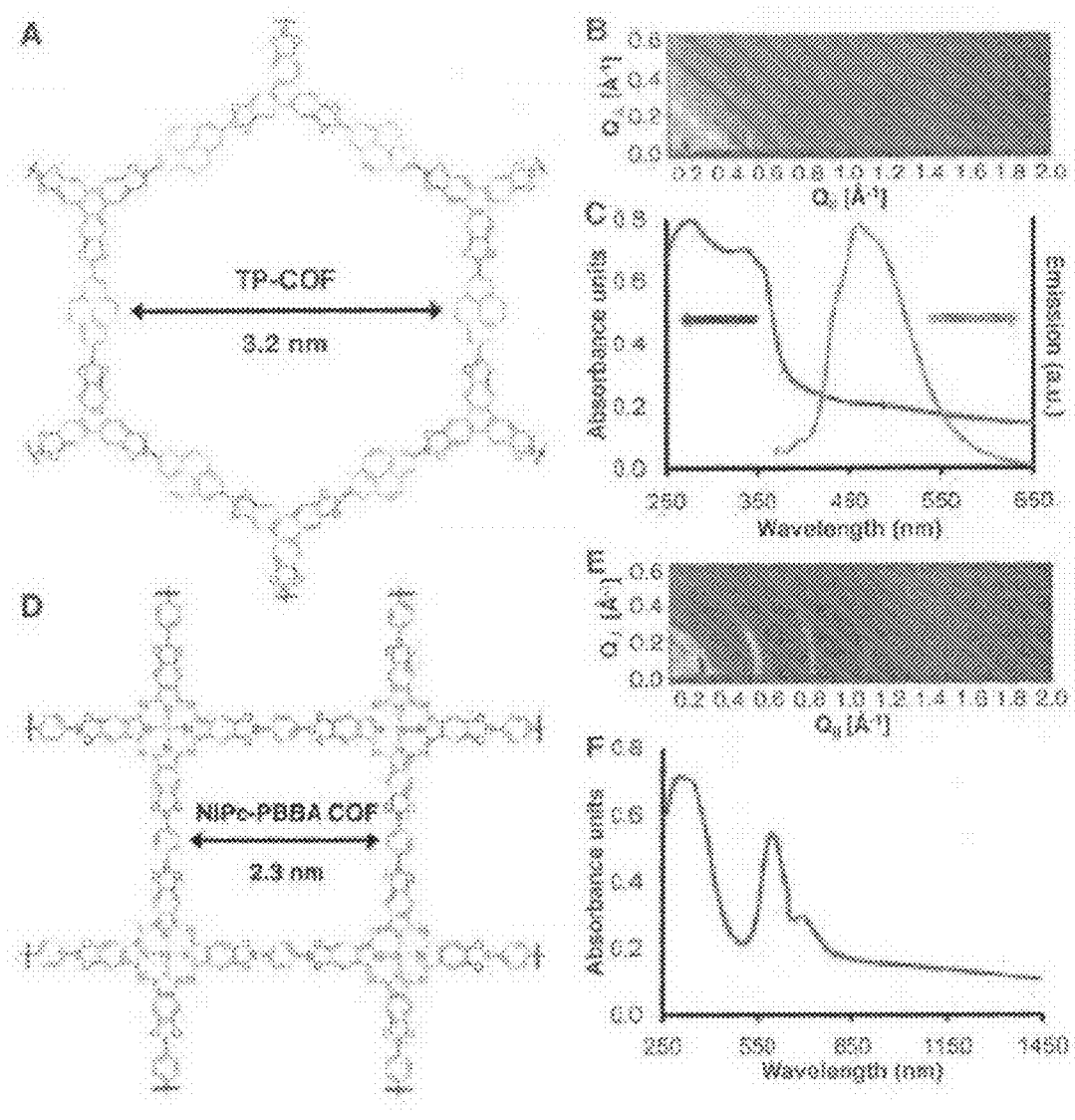
FIG. 9. (A) TP-COF chemical structure, (B) GID of an example of a TP-COF film on $SLG/SiO_2$, and (C) transmission UV/Vis spectrum and emission spectrum ($\lambda_{exc}$=352 nm) of the film. a.u., arbitrary units. (D) NiPc-PBBA COF chemical structure, (E) GID an example of a NiPc-PBBA COF film on $SLG/SiO_2$, and (F) transmission UV/Vis/NIR spectrum of the film.

The crystallinity and alignment of COF films on transparent SLG/$SiO_2$ substrates provides a means to organize functional π-electron systems within optoelectronic devices. Accordingly, films of two of the first COF semiconductors were grown on SLG/$SiO_2$. One of these frameworks, known as TP-COF, arises from incorporating a pyrene-2,7-diboronic acid linker in place of PBBA into the hexagonal COF-5 lattice (FIG. 9A). TP-COF in both film and powder form were obtained using similar conditions to those described above (see FIGS. 20-21 for top-down and cross-sectional micrographs). The GID of the films (FIG. 9B) indicates similar vertical alignment of the 2-D lattice, as judged by the attenuation of the signals with increasing Q- and the absence of the out-of-plane 001 diffraction. The increased pore size of TP-COF is apparent from the prominent 100 diffraction at 0.19 Å⁻¹, and the 110 (0.34 Å⁻¹), 200 (0.39 Å⁻¹), 210 (0.52 Å⁻¹) are also observed. Refinement of these data provided lattice parameters a=b=37.7 Å in excellent agreement with those derived from PXRD data of TP-COF powders (37.5 Å). The transparent SLG/$SiO_2$ substrate enabled ultraviolet/visible/near infrared (UV/Vis/NIR) spectroscopy of a COF film in transmission mode for the first time (FIG. 9C). The spectrum is consistent with the presence of both HHTP and pyrene chromophores and shows improved vibrational resolution of the absorbance bands relative to the diffuse reflectance spectrum of the powder sample. The photoluminescence of the film (FIG. 9C) is characteristic of pyrene excimer emission over all excitation wavelengths, arising from efficient energy transfer from HHTP to pyrene that was observed in TP-COF powders.

Figure 22:
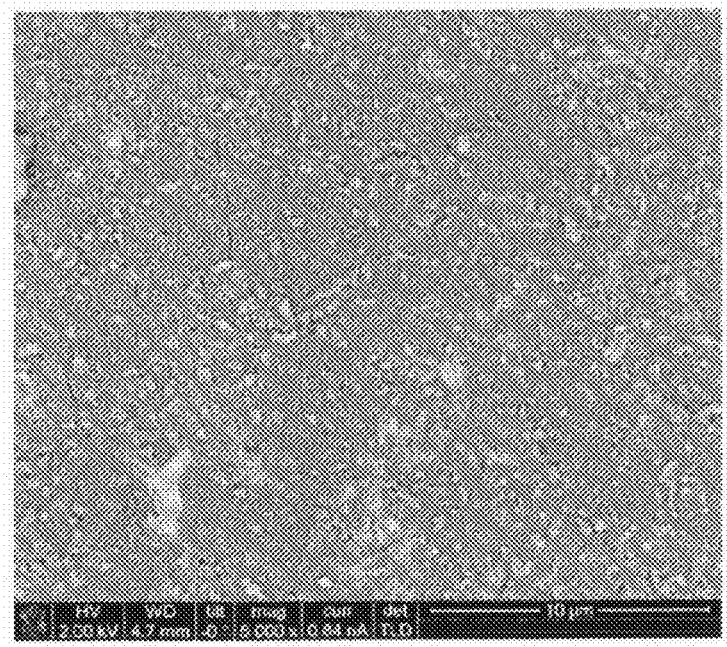
FIG. 22. Top-down SEM of an example of a NiPc-PBBA COF film on $SLG/SiO_2$ (growth time: 18 hours).
Figure 23:
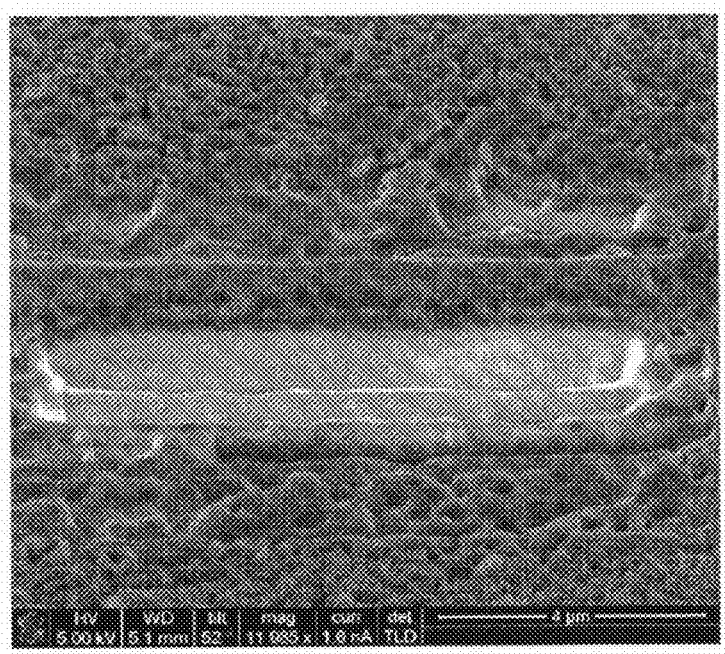
FIG. 23. Cross-sectional SEM image of an example of a NiPc-PBBA COF grown on $SLG/SiO_2$ (growth time: 18 hours).

Finally, it was confirmed that COFs lacking hexagonal symmetry may also be crystallized on SLG by preparing a Ni phthalocyanine-PBBA COF on SLG/$SiO_2$ (FIG. 9D). GID of the film (FIG. 9E) again exhibited diffraction peaks localized near $Q_\infty$=0 located at 0.27 Å⁻¹ (100), 0.55 Å⁻¹ (200), 0.81 Å⁻¹ (300), and 1.08 Å⁻¹ (400). These data correspond to a vertically aligned 2-D square lattice with parameters a=b=23.0 Å that match those obtained from the characterization of the powder sample. Cross-sectional images indicated a continuous film of approximately 210±25 nm thickness (FIGS. 22-23). The translucent, turquoise films absorb strongly over the visible range of the spectrum as a consequence of the Ni phthalocyanine chromophores (FIG. 9F). Both the films and the powders are nonemissive, as is expected for H-aggregated phthalocyanines. These vertically aligned, porous phthalocyanine COFs are intriguing precursors of ordered heterojunction films long thought to be ideal for organic photovoltaic performance.

EXAMPLE 2

A. Materials and Instrumentation. 1,4-phenylenebis(boronic acid) (PBBA) and 2,3,6,7,10,11-hexahydroxytriphenylene (HHTP), 1,4-dioxane, and mesitylene were purchased from commercial sources and used without further purification. Other solvents were purchased from commercial sources and purified using a custom-built activated alumina solvent purification system.

Fourier transform infrared spectroscopy (FTIR) was performed on a Thermo Nicolet iS10 spectrometer with a diamond ATR attachment. The spectra are uncorrected. UV/Vis/NIR absorbance spectroscopy of powder samples was performed on a Cary 5000 spectrophotometer using a praying mantis diffuse reflectance accessory. The background was recorded using potassium iodide ground in a mortar and pestle. Transmission mode spectra were recorded of COF films grown on SLG/$SiO_2$ substrates (~1.5 $cm^2$). The background was recorded using a similar SLG/$SiO_2$ substrate without the COF film.

Photoemission and excitation experiments were performed on a Horiba Jobin Yvon Fluorolog-3 fluorescence spectrophotometer equipped with a 450 W Xe lamp, double excitation and double emission monochromators, a digital photon-counting photomultiplier, and a secondary InGaAs detector for the NIR range. Correction for variations in lamp intensity over time and wavelength was achieved with a solid-state silicon photodiode as the reference. The spectra were further corrected for variations in photomultiplier response over wavelength and for the path difference between the sample and the reference by multiplication with emission correction curves generated on the instrument. Emission from COF films on SLG/$SiO_2$ was observed using a front face detection accessory.

Powder X-ray diffraction (PXRD) was performed on a Rigaku SmartLab X-Ray diffractometer in reflectance parallel beam/parallel slit alignment geometry. The measurement employed Cu $K\alpha$ line focused radiation at 1760 W (40 kV, 44 mA) power and a Ge crystal detector fitted with a 1.0 mm radiation entrance slit. Samples were mounted on zero-background sample holders by dropping powders from a wide-blade spatula and then leveling the sample surface with a glass microscope slide. No sample grinding or sieving was used prior to analysis. Samples were observed using a 0.04° $2\theta$ step scan from 2.0-34.0° with an exposure time of 0.4 second per step. No peaks could be resolved from the baseline for $2\theta>34°$ data and this region was not considered for further analysis.

Grazing incidence X-ray diffraction (GID) was performed at the G2 station at Cornell High Energy Synchrotron Source (CHESS) using a beam energy of 8.64±0.01 keV ($\lambda=0.1435$ nm), selected using a single-crystal Be crystal monochromator. Motorized slits were used to define a 0.2×3 (V×H) $mm^2$ beam, with a typical flux of $2\times10^{10}$ photons/s. The data were collected using a 640-element 1D diode-array, of which each element incorporates its own pulse counting electronics capable of count rates of ~$10^5$ photons/s. A set of 0.1° Soller slits were used on the detector arm to define the in-plane resolution. The scattering geometry is described in detail elsewhere. Each data set was collected by scanning the detector with the sample stationary. The incidence angle cc between the beam and sample surface was 0.175°. Axes labels $Q_\infty$ and $Q_\parallel$ are defined using the GISAXS convention $Q_\infty=4\pi/\lambda \sin(\nu/2)$ and $Q_\parallel=4\pi/\lambda \sin(\nu/2)$, where $\delta$ and $\nu$ are the vertical and horizontal scattering angles, respectively (24). At $\alpha=\delta=0$, $hQ_\parallel$ and $hQ_\infty$ (where h is Planck's constant) are the components of momentum transfer parallel and perpendicular to the sample surface, respectively.

Scanning electron microscopy (SEM) was performed on a FEI Strata 400 FESEM. Materials were deposited onto a sticky carbon surface on a flat aluminum platform sample holder. No metal sputtering of the sample was necessary.

Focused ion beam (FIB) patterning and milling was performed using a FEI Strata 400 FIB $Ga^+$ LIM system. A 1×10 μm Pt strip (~400 nm thickness) was deposited using the electron gun onto COF films grown on SLG/Cu and SLG/SiC substrates prior to exposing the sample to the FIB. The sample was then milled with the FIB using a cleaning cross-section. After milling, the samples were imaged at 5 keV using the electron gun. Cross-sectional images were obtained using a stage tilt angle of 52°. Thickness measurements made at this angle were corrected by multiplying by 1.26. SLG/$SiO_2$ substrates were grounded to the sample holder using sticky carbon prior to imaging to minimize charging. Top down and cross-sectional images at 2 keV were obtained in the same manner as the SLG/Cu and SLG/SiC substrates.

B. Methods. Graphene growth. Single-layer graphene was grown on Cu films using previously reported chemical vapor deposition methods. For SLG/$SiO_2$ substrates, SLG was grown on 25 μm-thick copper foil. A layer of PMMA (50 nm) was spin-coated on top of the graphene and the copper was etched using aqueous $FeCl_3$. The graphene was then transferred to fused $SiO_2$ and the PMMA removed by washing with $(CH_3)_2CO$. The SLG/$SiO_2$ was finally calcined at 300° C. for 2.5 hours.

SLG was grown epitaxially on SiC using a modified cold wall CVD-type reactor with dual heater elements. Some samples were prepared under high vacuum growth conditions in the 10-6 to 10-5 torr range. Additional samples utilized a near atmospheric argon pressure growth environment. The temperature regime was 1300-1450° C. for growth in vacuum and 1350-1550° C. in a low argon flow (0.7 bar to 1.2 bar). Semi-insulating chemical-mechanical polished (CMP) 1.2 cm×1.2 cm SiC wafer pieces were used as growth substrates.

General procedure for COF-5 film growth on SLG. HHTP (16 mg, 0.049 mmol) and PBBA (25 mg, 0.15 mmol) were added to a 15 mL cylindrical pressure vessel and suspended in a mixture of mesitylene and 1,4-dioxane (v/v 1:1; 1.0 mL). After capping, the mixture was sonicated for 30 minutes and a graphene-containing substrate was added. The sealed vessel was heated in a 90° C. oven for a given reaction time. The vessel was cooled to room temperature and the resulting gray powder was recovered by filtration and dried under vacuum. The graphene-containing substrate was submerged in anhydrous toluene (10 mL) overnight, sonicated for 5 seconds, and finally dried under vacuum. The PXRD, FTIR, and BET surface areas of the COF-5 powder samples matched the previous report (1).

General procedure for the growth of TP-COF film on SLG/$SiO_2$. The above procedure was followed using pyrene-2,7-diboronic acid (50 mg, 0.17 mmol) and HHTP (35 mg, 0.11 mmol) reactants. Crystalline films were observed in as few as 2 hours. The PXRD and FTIR of the TP-COF powder matched the previous report. These data, as well as the GID data and SEM images of the TP-COF films, are provided in section H.

General procedure for the growth of NiPc-PBBA COF film on SLG/$SiO_2$. The general growth procedure was followed using Ni octahydroxyphthalocyanine (10 mg, 0.014 mmol) and PBBA (7.0 mg, 0.042 mmol) reactants and a mixture of 1,4-dioxane (1.0 mL) and MeOH (0.5 mL) as the solvent. The reaction vessel was heated to 120° C. in an oven for 18 hours. PXRD and FTIR of the powders matched our own data of this material grown in the absence of SLG as well as recent published reports.

Figure 10:
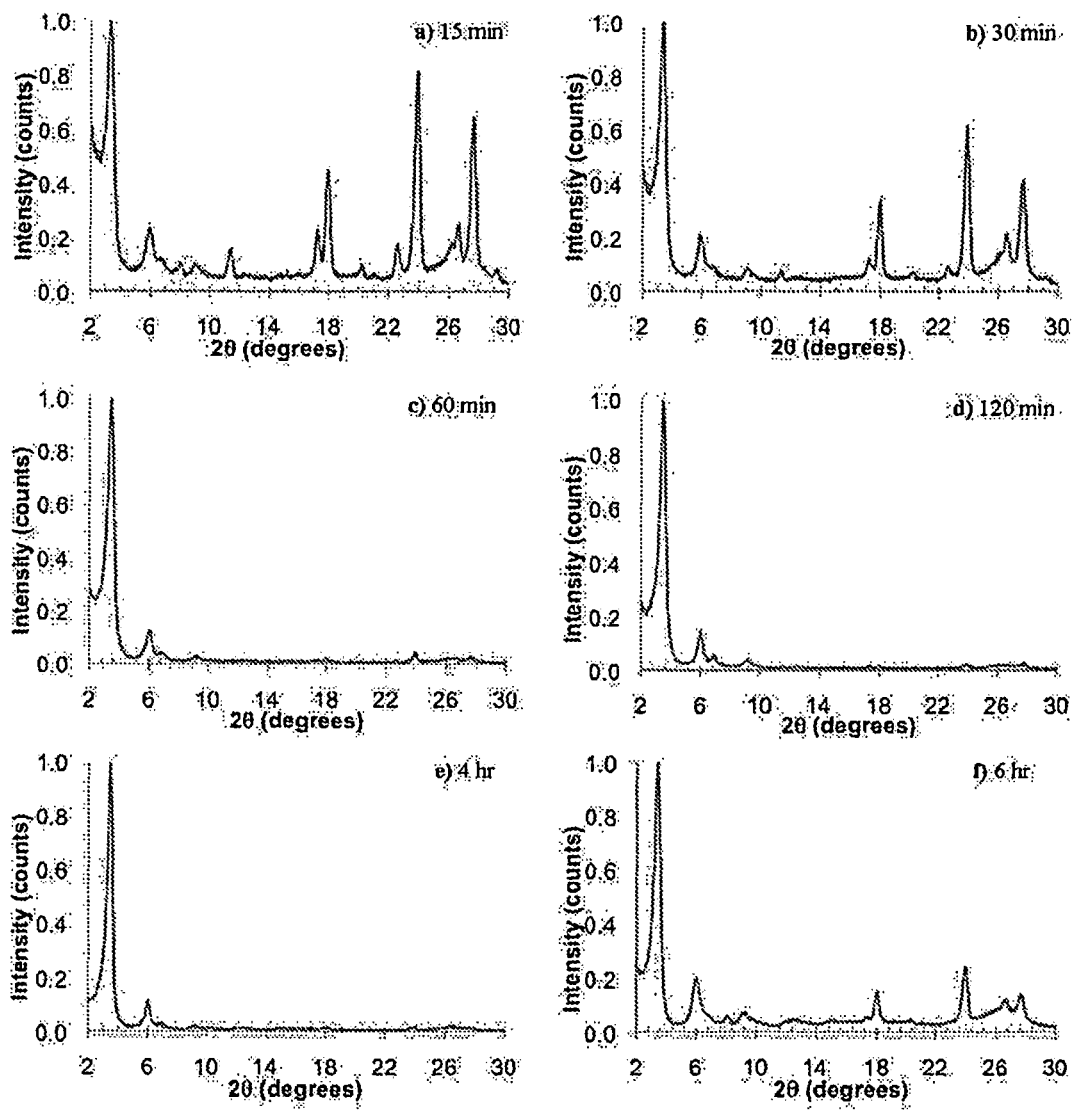
FIG. 10. An example of formation of COF-5 as a function of reaction time and the presence of an SLG-containing substrate. The formation of COF-5 required shorter reaction times than had been reported previously, both in the presence and absence of the SLG-containing substrate. The PXRD data show the evolution of crystallinity of COF-5 as a function of reaction time in the presence of $SLG/SiO_2$. The COF-5 diffractions appear even at the earliest reaction times, though these data also show prominent residual starting materials. PXRD patterns of an example of a COF-5 powder synthesized in the presence of SLG/Cu for varying reaction times. a) 15 minutes, b) 30 minutes, c) 60 minutes, d) 120 minutes, e) 4 hours, f) 6 hours.

C. COF-5 Powder Characterization. The following PXRD and FTIR data are representative of COF-5 powders isolated from reaction mixtures that include an SLG/Cu substrate. This is shown in FIG. 10.

Figure 2:
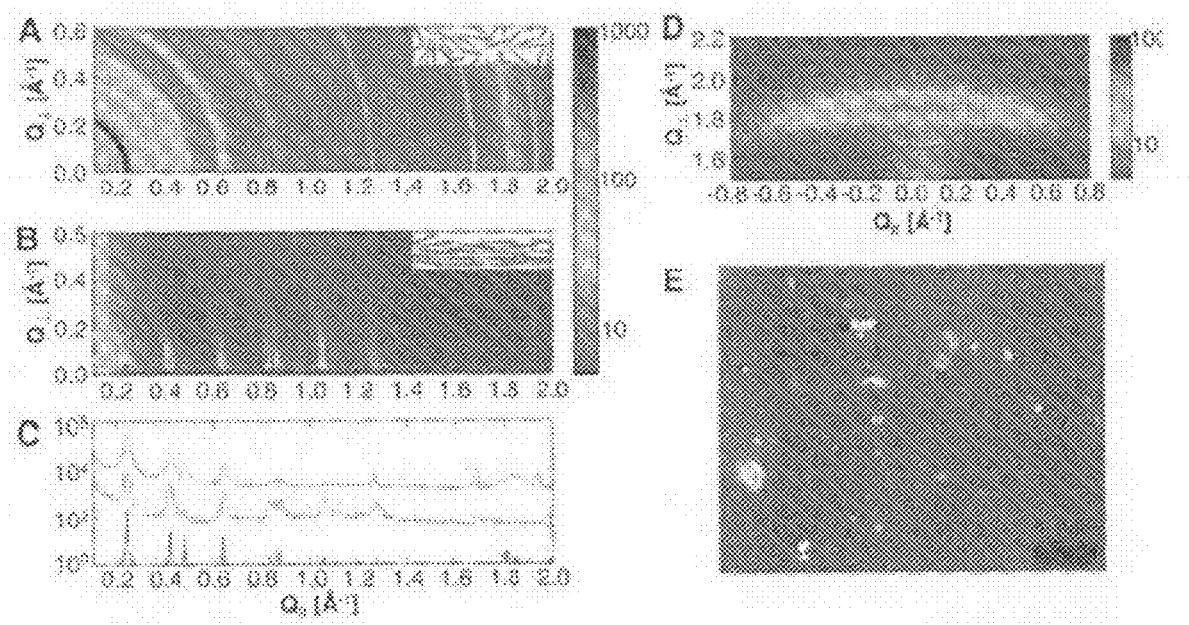
FIG. 2. (A) X-ray scattering data obtained from an example of a COF-5 powder; schematic of randomly oriented COF-5 grains in the powder, as indicated in (A). (B) GID data from a COF-5 film on SLG/Cu; schematic of oriented COF-5 grains in the film, as indicated in (B). (C) Projections of (A) (top) and (B) (middle) near $Q\perp=0$, and the simulated powder diffraction spectrum (bottom) for COF-5. (D) GID data obtained at large $Q\perp$, showing an off-specular projection of the COF-5 film (001) Bragg peak. (E) Top-down SEM image of the COF-5 film studied in (B), (C), and (D).
Figure 3:
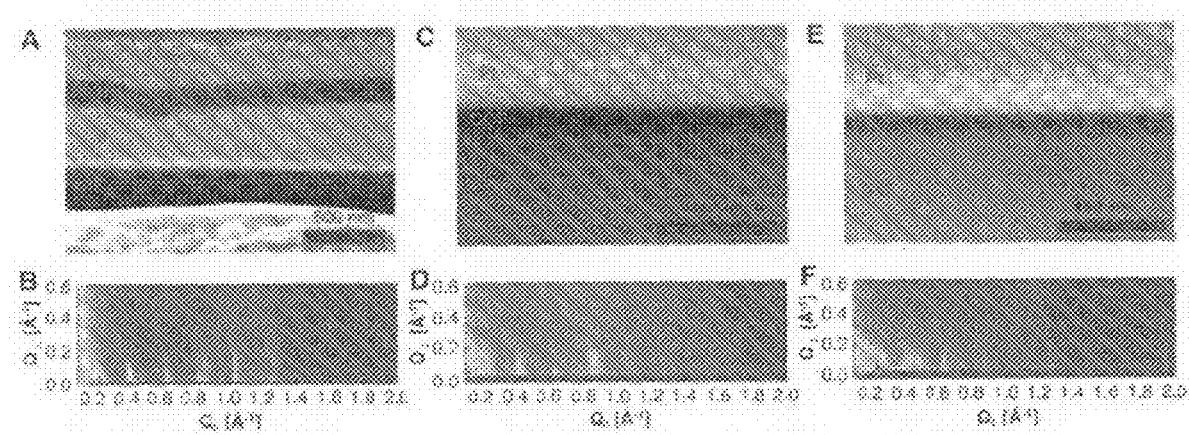
FIG. 3. (A) Cross-sectional SEM image of an example of a COF-5 film on SLG/Cu (30-minute growth time, 195±20-nm thickness) and (B) GID of the film. (C) Cross section of a COF-5 film on SLG/SiO$_2$ (2-hour growth time, 94±5-nm thickness) and (D) GID of the film. (E) Cross section of a COF-5 film on SLG/SiC (8-hour growth time, 73±3-nm thickness) and (F) GID of the film.

D. Mosaicity Estimate from GID. GID scans in FIGS. 2, 3, and 9 indicate that the COF films described here have fiber texture: that is, the π-stacking direction is distributed about the substrate surface normal. To obtain an estimate of the angular distribution, the azimuthal position of 001 intensity in scans such as shown in FIG. 2D is calculated $\lambda = \tan^{-1}(Q_{\parallel}/Q_{\infty})$. The scaled, background-subtracted results for each of the three films in FIG. 3 are shown in FIG. 11, showing nearly identical distributions for each of the three films. The FWHM of these distributions is ~26°. Note that because these scans are obtained in grazing incidence rather than in specular geometry, they do not correspond to ideal pole figure scans. Nevertheless, it is believed these scans provide a reasonable estimate—or at worst an upper bound—of the orientational order in the films. Finally, it should be noted that this estimate is in rough agreement with analysis of FIGS. 3B, 3D, and 3F, based on azimuthal integration of in-plane Bragg peaks.

E. Additional Micrographs of COF-5 Films on SLG/Cu, SLG/SiO$_2$, and SLG/SiC. Micrographs of COF-5 Films on SLG/Cu, SLG/SiO2, and SLG/SiC are shown in FIGS. 12-19.

Figure 20:
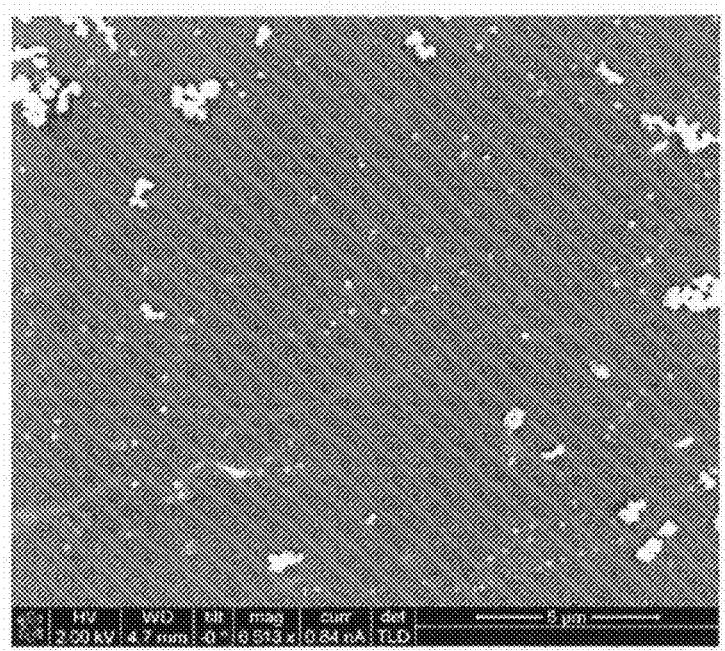
FIG. 20. Top-down SEM of an example of a TP-COF film on $SLG/SiO_2$ (growth time: 4 hours).
Figure 21:
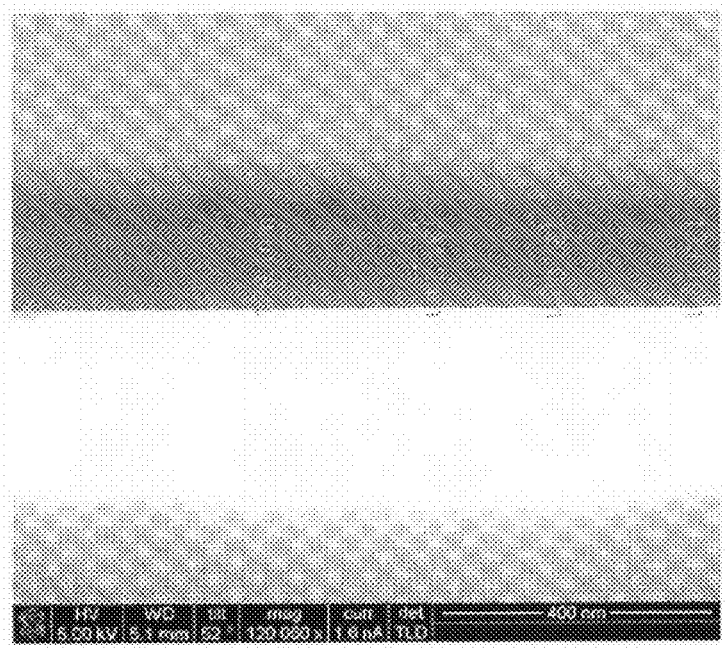
FIG. 21. Cross-sectional SEM of examples of TP-COF films on $SLG/SiO_2$ (growth time: 4 hours). From top to bottom, the layers are Pt, C film, TP-COF film, $SiO_2$ (appears white due to charging).

F. TP-COF Powder Characterization and Micrographs of Films on SLG/SiO$_2$. TP-COF Powder Characterization and Micrographs of Films on SLG/SiO$_2$ are shown in FIGS. 20-21.

G. NiPc-PBBA COF Micrographs of Films on SLG/SiO$_2$ and Powder Characterization. NiPc-PBBA COF Micrographs of Films on SLG/SiO$_2$ and Powder Characterization are shown in FIGS. 22-23.

EXAMPLE 3

Figure 8:
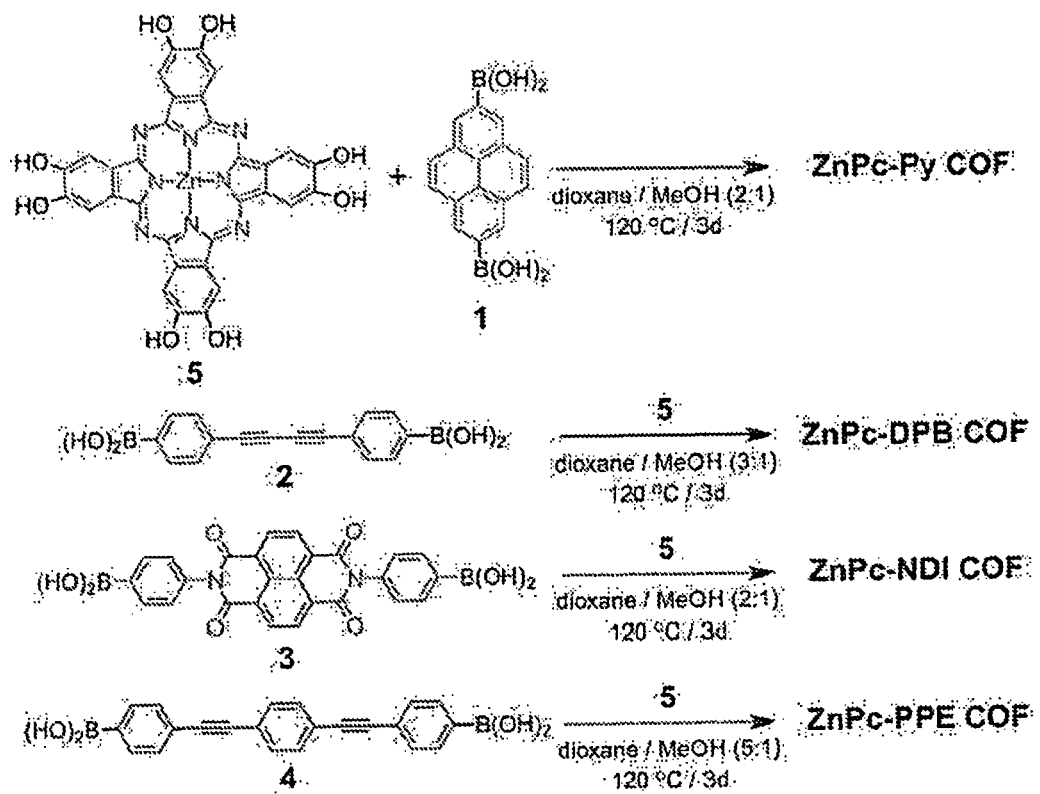
FIG. 8. An example of a synthesis of 2-D ZnPc covalent organic frameworks.

The COFs were synthesized as powders by condensing Zn octahydroxyphthalocyanine with each of the four different linear diboronic acid linkers shown in FIG. 8. 2,7-Pyrenediboronic acid produces ZnPc-Py COF, a square lattice with 2.7 nm-wide pores. 4,4'-diphenylbutadiynediboronic acid provides the ZnPc-DPB COF with 3.2 nm pores. 4,4'-diphenylnaphthalenediimidediboronic acid forms the ZnPc-NDI COF with 3.6 nm pores, and this π-electron deficient linker demonstrates a means to incorporate both π-electron donors and acceptors into a single COF. Finally, phenyl-1,4-bis(phenylethynyl)diboronic acid yields ZnPc-PPE COF with the largest 3.8 nm-wide pores. The COF syntheses were performed in sealed glass ampoules in 2:1, 3:1, or 5:1 mixtures of dioxane:MeOH at 120° C. for 72 hours. The COFs were isolated as an insoluble microcrystalline powder whose FT-IR spectra confirmed the formation of boronate ester linkages resonant near 1340 cm−1 and showed attenuated hydroxyl stretches. The COFs display excellent thermal stability, each retaining ~90% of its mass upon heating to 350° C. ZnPc-Py and ZnPC-NDI COF crystallize as needle-like structures, while ZnPc-DPB forms rough irregular sheets and ZnPc-PPE COF forms smooth µm-size aggregated spheroids, as observed by scanning electron microscopy (SEM).

Figure 5:
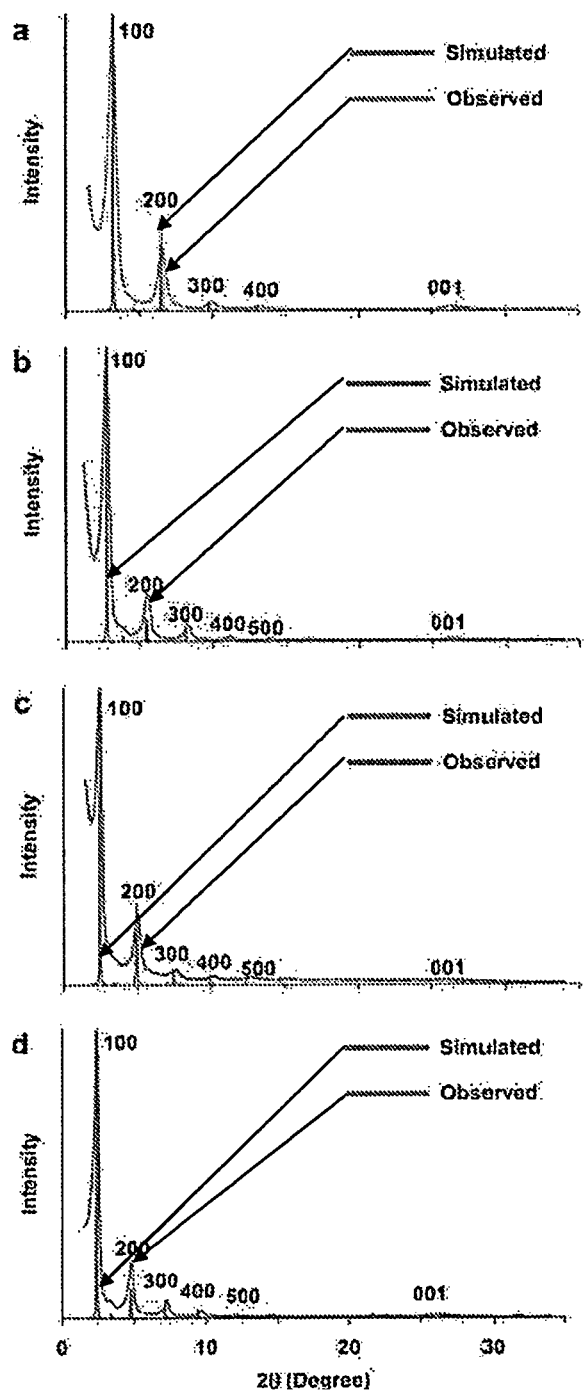
FIG. 5. An example of PXRD patterns of COFs. Experimental vs. predicted, PXRD patterns of (a) ZnPC-Py COF, (b) ZnPc-DPB COF (c) ZnPc-NDI COF and (d) ZnPc-PPE COF. The indexed diffraction peaks are labeled.

Each COF is comprised of ZnPc building blocks and linear linkers of varying length and forms square planar sheets that stack in an eclipsed or nearly eclipsed fashion. Based on this hypothesis, the eclipsed crystal structures of each material were modeled and their powder X-ray diffraction patterns simulated using the Materials Studio suite of programs. The COFs display diffraction patterns consistent with the simulations, crystallizing as cofacially-stacked two-dimensional sheets with P4/mmm symmetry, in accordance with the free base and Ni phthalocyanine COFs linked by phenylenebis(boronic acid). Also, a staggered structure in which the ZnPc moieties in adjacent layers are offset by half a unit cell distance along the a and b axes was considered. The simulated PXRD patterns of these structures do not match the experiments. The excellent agreement between simulated and observed patterns facilitated lattice vector assignment of the observed peaks following Pawley refinement. Each of the PXRD patterns (FIG. 5) are quite similar and feature an intense degenerate (100/010) diffraction peak at low 2θ. ZnPc-Py COF exhibited this peak at 2θ=3.20°, ZnPc-DPB COF at 2.67°, ZnPc-NDI COF at 2.44° and ZnPc-PPE COF at 2.36°. Lattice spacings based on the refined profiles correspond to unit cell parameters a=b=27.0, 32.2, 35.7 and 38.4 Å, respectively. The ZnPc COFs show (001) diffraction peaks centered near 26.6°, indicating an approximate interlayer stacking distance of 3.35 Å, which is similar to other 2-D COFs, boron nitride, and graphite. Each of the PXRD patterns exhibits narrower peaks than most reported COFs, and even the weak (110) diffraction peaks are well-resolved for the ZnPc-DPB and ZnPc-PPE COF. Despite the excellent crystallinity of these samples, the X-ray diffraction data do not preclude small deviations from perfectly eclipsed stacking. Based on typical π-π (stacking geometries and DFT calculations performed on other boronate-linked 2-D COFs, it is likely that adjacent layers are offset by ~1.7 Å, which should be considered in future models of interlayer exciton and charge transport. Diffuse reflectance absorbance spectroscopy of the COF powders shows that each COF absorbs light throughout the visible and near-IR regions. The highly absorbent ZnPc chromophore dominates the spectrum of each material, and the spectra of the four COFs are very similar. They are red shifted relative to H$_2$Pc COFs and very similar to the phenylene-linked NiPc COF, which was photoconductive under NIR excitation.

The porosity and surface areas of the ZnPc COFs were characterized by N$_2$ adsorption after activating the powders by washing with toluene and heating under vacuum. The COFs exhibit Type IV isotherms typical of mesoporous materials, with initial adsorption into the pores at low relative pressures (0<P/Po<0.05). Desorption follows the same general pathway, indicating reversible N$_2$ uptake. The Langmuir surface-area model was applied to the 0.05<P/Po<0.20 region of the curves, which provided surface areas of 596 m$^2$/g for ZnPc-Py COF, 800 m$^2$/g for ZnPc-DPB COF, 1040 m$^2$/g for ZnPc-NDI COF and 617 m$^2$/g for ZnPc-PPE COF. These surface areas are similar to previous H2Pc and NiPc COFs, but these values have not been optimized by varying the synthesis and activation procedures. The small hysteresis seen during desorption for each COF is attributable to interparticle adsorption.

Figure 6:
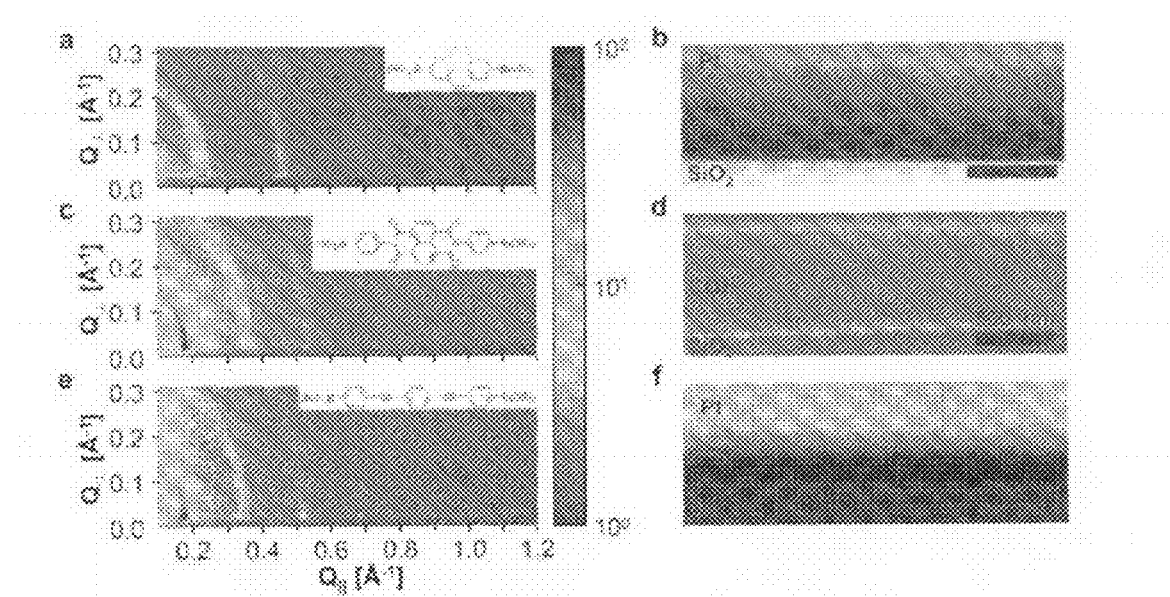
FIG. 6. An example of GID patterns of oriented COF films. Grazing incidence X-ray diffraction patterns and cross-sectional SEM for ZnPc-Py COF (a, b); ZnPc-NDI COF (c, d); ZnPc-PPE COF (e, f). The maximum intensity of each (100) peak is normalized to 100 counts.
Figure 7:
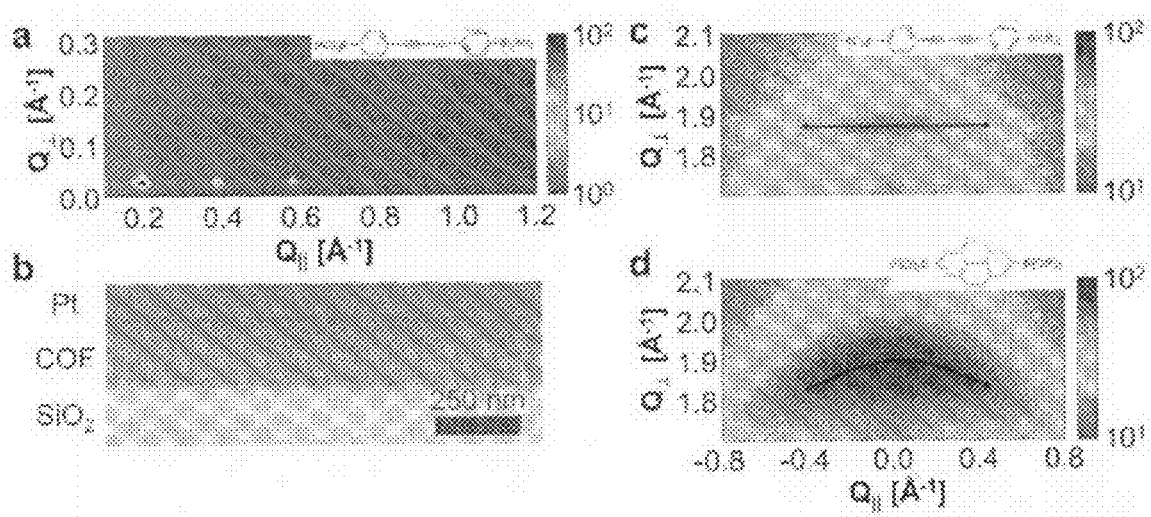
FIG. 7. Improved crystallinity and alignment of an example of ZnPc-DPB COF film. Grazing incidence X-ray diffraction pattern (a) and cross-sectional SEM (b) of an example of ZnPc-DPB COF. The (100) Bragg peak intensity is normalized to the same scale as in FIG. 6. The intensity of the off-specular projection of the (001) Bragg peak for an example of ZnPc-DPB COF (c) is flat with respect to Q', indicating nearly zero mosaicity, while that of an example of ZnPc-Py COF (d) is representative of other COF films and shows an arc of scattering (see arrow) typical of less ideal vertical alignment.

Despite their intriguing structures, COF powders are difficult to interface to electrodes or incorporate into devices. Thus, each 2-D ZnPc COF was grown as a crystalline, vertically oriented film on a transparent SLG-functionalized fused silica substrate (SLG/SiO$_2$). For example, ZnPc-Py COF films were obtained by condensing 1 and 5 in a mixture of dioxane, MeOH, N,N-dimethylacetamide (DMA), and 1,2-dichlorobenzene (DCB) (3:1:2:1 v/v) in the presence of SLG/SiO$_2$. This solvent combination provided each of the ZnPc COFs as crystalline, oriented films and was modified from the DMA/DCB mixture for a NiPc COF powder. Interestingly, a DMA/DCB mixture lacking the other cosolvents provided crystalline COF films on the SLG whose grains showed no preferred orientation. Grazing incidence X-ray diffraction (GID, FIG. 6a) of the ZnPc-Py COF film shows scattering intensity at 0.22 Å$^{-1}$, 0.46 Å$^{-1}$, 0.69 Å$^{-1}$, 0.92 Å$^{-1}$, corresponding to the (100), (200), (300), and (400) peaks observed in the powder samples. This intensity is concentrated near $Q_\perp=0$, indicating that the c-axis of the COF is oriented normal to the substrate surface. The (001) Bragg peak that appears at $Q_\parallel=1.83$ Å$^{-1}$ in powder samples is not observed in the GID experiment, further confirming that the c-axis is oriented normal to the substrate. Instead, the (001) peak is observed as a diffuse arc of scattering from $Q_\perp=1.85$ to 1.90 Å$^{-1}$ in measurements performed at large out-of-plane diffraction angles (see FIG. 7d). These scans indicate an angular spread of the stacking direction, or mosaicity, of ±11 degrees. Cross sectional SEM obtained by milling the sample with a Ga+ focused ion beam indicates a 400±12 nm thick continuous film.

Similar crystalline, vertically oriented ZnPc-NDI and ZnPc-PPE COF films were obtained by condensing diboronic acid linkers 3 or 4 with 5 under the conditions described above. GID of the ZnPc-NDI COF film (FIG. 6c) indicates scattering intensity at 0.18 Å$^{-1}$, 0.36 Å$^{-1}$, 0.44 Å$^{-1}$, corresponding to the same (100), (200), and (300) peaks observed in the powder samples. A weak (110) Bragg peak not observed in the powder samples is observed at 0.26 Å$^{-1}$. GID of the ZnPc-PPE COF (FIG. 6e) film indicates scattering intensity at 0.17 Å$^{-1}$, 0.34 Å$^{-1}$, 0.51 Å$^{-1}$, 0.69 Å$^{-1}$, which represent the (100), (200), (300), and (400) Bragg peaks. The (001) Bragg peak that appears at $Q_\parallel=1.83$ Å$^{-1}$ in each powder sample is again absent in the GID of each film, but is found to be quite similar to that shown in FIG. 7d in out-of-plan scans. Cross-sectional SEM indicate 580±84 nm and 200±18 nm thick films for the ZnPc-NDI (FIG. 6d) and ZnPc-PPE COF (FIG. 60, respectively.

Though grown under the same conditions, the ZnPc-DPB COF films show superior crystallinity and vertical alignment. The GID (FIG. 7a) of a 294±6 nm thick film (FIG. 7b) indicates near complete localization of the scattering intensity near $Q_\perp=0$. In contrast to FIGS. 6a,c,e, the peak intensity at $Q_\perp=0.028$ is over 20 times higher than that in the diffuse arc of scattering extending towards larger $Q_\perp$, suggesting a mosaic spread below 0.2 degrees. Peaks at 0.19 Å$^{-1}$, 0.28 Å$^{-1}$, 0.39 Å$^{-1}$, 0.58 Å$^{-1}$, and 0.78 Å$^{-1}$ correspond to the (100), (110), (200), (300), and (400) peaks observed in the powders. (500) and (600) Bragg peaks not observed in the powder diffraction pattern are observed at 0.97 Å$^{-1}$, and 1.16 Å$^{-1}$, respectively. The off-specular (001) Bragg peak at $Q_\parallel=1.86$ Å−1 (FIG. 7c) is distinct from ZnPc-Py COF (FIG. 7d) or other 2-D ZnPc COFs. First, the intensity distribution is flat, rather than curved, indicating that its width in $Q_\parallel$ arises from finite lateral grain size, rather than mosaic spread. This observation is consistent with the low mosaic spread deduced from FIG. 7a. Second, the background-subtracted width of the peak along $Q_\perp$ is narrower than that in ZnPc-Py COF (FIG. 7d), indicating a longer correlation length along the stacking direction. This peak width is resolution-limited due to the geometric expansion of the beam as a consequence of the grazing incidence geometry. Additional scans (see FIGS. 25-26) performed with improved resolution indicate a correlation length in the stacking direction of ~31 nm (~94 layers), far exceeding that found in other COF films. For example, the ZnPc-Py COF data in FIG. 7d, which is not resolution-limited, gives a correlation length of ~4 nm or 12 layers. The ZnPc-DPB COF's superior order is attributed partially to its diphenylbutadiyne linker, which can readily adopt a coplanar conformation needed for COF formation, though it may prove possible to obtain similar order in the other ZnPc COF films through further optimization.

EXAMPLE 4

A general procedure for Preparation of ZnPc COF powders. The appropriate diboronic acid (0.060 mmol) and zinc octahydroxphthalocyanine (0.018 g, 0.025 mmol) were suspended in dioxane:MeOH (3 mL, ratios given in Scheme 1) and sonicated for 10 minutes. The resulting dark green suspension was transferred to a 10 mL pre-scored long-necked glass ampoule, flash-frozen in a liquid nitrogen bath, and flame-sealed. The ampoule was placed in a 120° C. oven for 72 hours, and the resulting free-flowing dark green powder was collected by filtration on a Hirsch funnel, washed with anhydrous toluene (1 mL) and air-dried. The powders were subsequently dried under vacuum before characterization.

EXAMPLE 5

A general procedure for preparation of COF Films. In a cylindrical pressure vessel, the appropriate diboronic acid (0.109 mmol) and zinc octahydroxyphthalocyanine (0.035 g, 0.050 mmol) were suspended in a 3:1:2:1 mixture of dioxane:MeOH: N,N-dimethylacetamide:1,2-dichlorobenzene (3 mL) and sonicated for 30 minutes. A SLG/SiO$_2$ substrate was added and the reaction vessel was sealed. The vessel was placed in a 120° C. oven for 24 hours, after which the chip was removed and rinsed with anhydrous toluene (5 mL) and dried under vacuum.

EXAMPLE 6

A. Materials. All reagents were purchased from commercial sources and used without further purification. Zn octahydroxyphthalocyanine 5, pyrene diboronic acid 1, and diphenylbutadiyne diboronic acid 2 were prepared via literature procedures. 1,4-Dioxane and propionic acid were purchased from commercial sources and used without further purification. Other solvents were purchased from commercial sources and purified using a custom-built alumina-column based solvent purification system.

Instrumentation. Infrared spectra were recorded on a Thermo Nicolet iS10 with a diamond ATR attachment and are uncorrected.

UV/Vis absorbance spectra were recorded on a Cary 5000 UV-Vis-NIR spectrophotometer with a mercury lamp in either dichloromethane solution or as solids using a praying mantis diffuse reflectance accessory. Emission and excitation spectra were recorded on a Horiba Jobin Yvon Fluorolog-3 fluorescence spectrophotometer equipped with a 450 W Xe lamp, double excitation and double emission monochromators, a digital photon-counting photomultiplier and a secondary InGaAs detector for the NIR range. Correction for variations in lamp intensity over time and wavelength was achieved with a solid-state silicon photodiode as the reference. The spectra were further corrected for variations in photomultiplier response over wavelength and for the path difference between the sample and the reference by multiplication with emission correction curves generated on the instrument. Solid samples were mounted between quartz slides and mounted on a solid sample holder, and emission was observed using a front face detection accessory.

X-ray diffraction patterns were recorded on a Rigaku Smartlab Powder X-Ray Diffractometer in 2θ medium resolution parallel beam/PSA mode employing Cu Kα line focused radiation at 40 kV, 44 mA power and equipped with a Ge crystal detector fitted with a 0.5 mm radiation entrance slit. Samples were mounted on zero background sample holders by dropping powders from a wide-blade spatula and then leveling the sample surface with a glass microscope slide. No sample grinding or sieving was used prior to analysis. Samples were observed using a 0.045° 2θ step scan from 1.0-34° (Omega=1.0°) with an exposure time of 0.4 second per step. No peaks could be resolved from the baseline for 2θ>34° data, which was therefore not considered for further analysis.

Thermogravimetric analysis from 20-600° C. was carried out on a TA Instruments Q500 Thermogravimetric Analyzer in an N2 atmosphere using a 10° C./min ramp without equilibration delay.

Scanning electron microscopy (SEM) was performed on a FEI Strata 400 FESEM. Materials were deposited onto a sticky carbon surface on a flat aluminum platform sample holder. No metal sputtering of the sample was necessary. Focused ion beam (FIB) patterning and milling was performed using a FEI Strata 400 FIB Ga+LIM system. A 1×10 μm Pt strip (~1 μm thickness) was deposited using the electron gun onto COF films grown on SLG/SiO$_2$ substrates prior to exposing the sample to the FIB. The sample was then milled with the FIB using a cleaning cross-section. After milling, the samples were imaged at 2 keV using the electron gun. Cross-sectional images were obtained using a stage tilt angle of 52°. Thickness measurements made at this angle were corrected by multiplying by 1.26. SLG/SiO$_2$ substrates were grounded to the sample holder using sticky carbon prior to imaging to minimize charging.

Mass spectra were obtained on a Waters MALDI micro MX MALDI-TOF mass spectrometer using positive ionization and a reflectron detector. MALDI samples were prepared by wet deposition of a saturated analyte/dithranol matrix solution onto a metallic sample plate and air dried before loading into the instrument.

Surface area measurements were conducted on a Micromeritics ASAP 2020 Accelerated Surface Area and Porosimetry Analyzer using ca. 20 mg samples degassed at 180° C. for 12 hours. Nitrogen isotherms were generated by incremental exposure to ultra high purity nitrogen up to ca. 1 atm over 28-hour periods in a liquid nitrogen (77K) bath, and surface parameters were determined using Langmuir, BET and BJH adsorption models included in the instrument software (Micromeritics ASAP 2020 V1.05).

NMR spectra were recorded on a Bruker ARX 300 MHz spectrometer using a standard 1H/X Z-PFG probe at ambient temperature with a 20 Hz sample spin rate.

X-ray photoelectron spectroscopy was performed on a Surface Science Instruments Model SSX-100 using monochromated Al Kα radiation (1486.6 eV) and a 5 keV Argon ion beam for sample cleaning.

Grazing incidence X-ray diffraction (GID) was performed at the G2 station at Cornell High Energy Synchrotron Source (CHESS) using a beam energy of 8.78±0.01 keV (λ=0.1414 nm), selected using a single-crystal Be crystal monochromator. Motorized slits were used to define a 0.2×2 (V×H) mm$^2$ beam, with a typical flux of 2×10$^{10}$ photons/s. The data were collected using a 640-element 1D diode-array, of which each element incorporates its own pulse counting electronics capable of count rates of ~10$^5$ photons/s. A set of 0.1° Soller slits were used on the detector arm to define the in-plane resolution. The scattering geometry is described in detail elsewhere. Each data set was collected by scanning the detector with the sample stationary. The incidence angle cc between the beam and sample surface was 0.175°. Axes labels $Q_\perp$ and $Q_\parallel$ are defined using the GISAXS convention $Q_\infty=4\pi/\lambda \sin(\delta/2)$ and $Q_\parallel=4\pi/\lambda \sin(\nu/2)$, where δ and ν are the vertical and horizontal scattering angles, respectively. At α=δ=0, hQ$_\parallel$ and hQ$_\infty$ (where h is Planck's constant) are the components of momentum transfer parallel and perpendicular to the sample surface, respectively.

B. Synthetic Procedures. General procedure for COF powder synthesis and ZnPc-Py COF. Pyrene diboronic acid 1 (17 mg, 0.059 mmol) and Zn octahydroxyphthalocyanine 5 (20 mg, 0.028 mmol) were suspended in a mixture of dioxane and MeOH (2:1, 3 mL) and sonicated for 10 minutes. The dark green suspension was transferred to a 10 mL pre-scored long-necked glass ampoule, flash-frozen in liquid N$_2$, and flame-sealed. The ampoule was placed in an oven at 120° C. for 72 hours, and the resulting free-flowing dark green powder was collected by filtration on a Hirsch funnel, washed with anhydrous toluene (1 mL), and air-dried. The resulting ZnPc-Py COF powder (10 mg, 52%) was dried under vacuum before characterization by PXRD and IR. ZnPc-Py COF: IR (powder, ATR) 3233, 1607, 1459, 1369, 1337, 1271, 1231, 1106, 1078, 1023, 902, 870, 824, 742, 714 cm$^{-1}$. PXRD [2θ (relative intensity)] 3.22 (100), 6.50 (24), 9.92 (5.6), 13.16 (4.3), 26.62 (6.4). UV-Vis (powder, praying mantis DRA) 711, 377 (sh), 336, 284. Anal. Calcd. for $(C_{64}H_{24}B_4N_8O_8Zn)_n$: C, 67.34; H, 2.12; N, 9.82. Found: C, 63.65; H, 2.20; N, 10.34. It has been noted that elemental analysis of boronate COFs typically give lowered carbon values from the formation of non-combustible boron carbide byproducts. The presence of boron was confirmed by a characteristic B is peak in the XPS with a binding energy of 190.8 eV.

ZnPc-DPB COF. The above procedure was followed using diphenyl butadiynediboronic acid 2 (17 mg, 0.059 mmol), Zn octahydroxyphthalocyanine 5 (14 mg, 0.020 mmol), and a 3:1 mixture of dioxane and methanol (3:1, 1.3 mL) solvent. 12 mg (53%) of the ZnPc-DPB COF were isolated. IR (powder, ATR) 3244, 1607, 1472, 1371, 1338, 1268, 1180, 1081, 1018, 869, 830, 742 cm$^{-1}$. PXRD [2θ (relative intensity)] 2.66 (100), 3.74 (4.7), 5.45 (15), 8.29 (5.9), 11.04 (1.9), 13.82 (1.3), 16.48 (0.86), 26.83 (2.2). UV-Vis (powder, praying mantis DRA) 713, 361 (sh), 301, 275 (sh). Anal. Calcd for $(C_{64}H_{24}B_4N_8O_8Zn)_n$: C, 67.34; H, 2.12; N, 9.82. Found: C, 54.15; H, 2.19; N, 9.68. It has been noted that elemental analysis of boronate COFs typically give lowered carbon values from the formation of non-combustible boron carbide byproducts. The presence of boron was confirmed by a characteristic B is peak in the XPS with a binding energy of 191.7 eV.

ZnPc-NDI COF. The above procedure was followed using napthalenediimide diboronic acid 3 (36 mg, 0.071 mmol), Zn octahydroxyphthalocyanine 5 (17 mg, 0.024 mmol), and a 2:1 mixture of dioxane and MeOH (3 mL) solvent. 23 mg (60%) of the ZnPc-NDI COF were isolated. ZnPc-NDI COF: IR (powder, ATR) 3338, 1714, 1671, 1613, 1582, 1514, 1479, 1451, 1376, 1342, 1272, 1251, 1200, 1119, 1085, 1022, 984, 870, 835, 768, 742, 719 cm$^{-1}$. PXRD [2θ (relative intensity)] 2.44 (100), 5.00 (27), 7.52 (7.0), 12.52 (3.3), 26.92 (2.6). UV-Vis (powder, praying mantis DRA) 693, 333 (sh), 296. Anal. Calcd for $(C_{84}H_{32}B_4N_{12}O_{16}Zn)_n$: C, 64.10; H, 2.05; N, 10.68. Found: C, 55.41; H, 2.56; N, 11.09. It has been noted that elemental analysis of boronate COFs typically give lowered carbon values from the formation of non-combustible boron carbide byproducts. The presence of boron was confirmed by a characteristic B is peak in the XPS with a binding energy of 191.3 eV.

ZnPc-PPE COF. The above procedure was followed using PPE diboronic acid 4 (22 mg, 0.060 mmol), Zn octahydroxyphthalocyanine 5 (15 mg, 0.021 mmol), and a 5:1 mixture of dioxane and MeOH (3 mL) solvent. 20 mg (73%) of the ZnPc-PPE COF were isolated. ZnPc-PPE COF: IR (powder, ATR) 3060, 2930, 1711, 1605, 1472, 1395, 1351, 1270, 1227, 1187, 1042, 1015, 945, 915, 872, 830, 745, 704 cm$^{-1}$. PXRD [2θ (relative intensity)] 2.28 (100), 4.76 (18), 7.20 (6.9), 9.68 (3.4), 12.16 (2.5), 26.52 (2.3). UV-Vis (powder, praying mantis DRA) 693, 331, 308 nm. Anal. Calcd for $(C_{84}H_{32}B_4N_{12}O_{16}Zn)_n$: C, 70.56; H, 2.49; N, 8.66. Found: C, 59.20; H, 2.58; N, 8.70. It has been noted that elemental analysis of boronate COFs typically give lowered carbon values from the formation of non-combustible boron carbide byproducts. The presence of boron was confirmed by a characteristic B is peak in the XPS with a binding energy of 191.3 eV.

N,N'-bis(4-iodophenyl)naphthalene-1,4,5,8-tetracarboxylic diimide (7). Naphthalene-1,4,5,8-tetracarboxylic dianhydride 6 (1.30 g, 4.85 mmol) and 4-iodoaniline (3.20 g, 10.5 mmol) were refluxed in propionic acid (80 mL) for 18 hours under N$_2$. The brown solution was cooled to rt and the resulting precipitate was collected by filtration and washed with MeOH (4×20 mL). The resulting light brown solid 7 (2.40 g, 74%) was used without further purification. Its poor solubility precluded acquisition of a suitable $^{13}$C-NMR spectrum. 7: $^1$H-NMR (DMSO-d$_6$, 300 MHz) δ 8.72 (s, 4H); 7.94 (d, J=9 Hz, 4H); 7.30 (d, J=9 Hz, 4H). MALDI-MS m/z (%) 542.9 (44, M$^+$-I); 543.9 (52, M$^+$+1-I); 669.8 (100, M$^+$); 670.8 (53, M$^+$+1). IR (powder, ATR) 3100, 3068, 3049, 1711, 1670, 1577, 1484, 1446, 1344, 1248, 1198, 1118, 1006, 980, 884, 850, 827, 766, 741 cm$^{-1}$. UV-Vis [λ/nm (log ε/M$^{-1}$ cm$^{-1}$), 6.9 μM in DMF] 380 (4.43), 360 (4.43), 340 (4.34). Anal. Calcd for $(C_{26}H_{12}I_2N_2O_4)$: C, 46.60; H, 1.80; N, 4.18. Found: C, 47.77; H, 1.84; N, 4.22.

Naphthalenediimide dipinacolatoboronic ester (8). Naphthalene diimide diiodide 7 (138 mg, 0.206 mmol) and nickel(II) diphenylphosphinopropane dichloride (9.0 mg, 0.017 mmol) were heated to reflux in toluene (2 mL) and N,N-diisopropylethylamine (1 mL) under N$_2$. Pinacol borane (100 μL, 0.69 mmol) was added by syringe and the mixture was stirred for 12 hours. After cooling to rt, saturated aqueous NH$_4$Cl (30 mL) was added to the dark brown mixture. The biphasic liquid was diluted with EtOAc (40 mL) and was washed with H$_2$O (3×40 mL). The organic layer was evaporated to provide a pale yellow solid, which was suspended in EtOAc (10 mL) and centrifuged for 30 minutes at 4000 rpm. This suspension/centrifugation procedure was repeated twice. The tan solid 8 (73 mg, 53%) was dried under vacuum and used without further purification. 8: $^1$H-NMR (CDCl$_3$, 300 MHz) δ 8.84 (s, 4H); 8.04 (d, J=9 Hz, 4H); 7.36 (d, J=9 Hz, 4H); 1.38 (s, 24H). $^{13}$C-NMR (CDCl$_3$, 300 MHz) δ 163, 138, 136, 132, 130, 128, 128, 127, 84, 25. IR (powder, ATR) 3088, 2980, 2940, 1713, 1675, 1607, 1581, 1447, 1399, 1359, 1342, 1321, 1246, 1213, 1198, 1169, 1143, 1120, 1086, 1022, 983, 963, 860, 824, 794, 769, 717 cm$^{-1}$. UV-Vis [λ/nm (log ε/M$^{-1}$ cm$^{-1}$), 8.1 μM in DMF] 380 (4.43), 360 (4.42), 343 (4.25). Anal. Calcd for $(C_{38}H_{36}B_2N_2O_8)$: C, 68.09; H, 5.41; N, 4.18. Found: C, 68.05; H, 5.39; N, 4.28.

Naphthalenediimide diboronic acid (3). Ester 8 (30 mg, 0.045 mmol) and NaIO$_4$ (20 mg, 0.094 mmol) were suspended in a 4:1 THF:H$_2$O solution (0.6 mL). The resulting tan mixture was stirred for 2 hours, after which aqueous HCl (1M, 1 mL) was added. The pale yellow suspension was stirred for 18 hours and diluted with H$_2$O (5 mL), filtered, and rinsed with another 5 mL H$_2$O. The resulting tan solid was dried under vacuum to provide the diboronic acid 3 (16 mg, 70%). 3: $^1$H-NMR (DMSO-d$_6$, 300 MHz) δ 8.72 (s, 4H); 8.23 (s, 4H); 7.94 (d, J=6 Hz, 4H); 7.42 (d, J=6 Hz, 4H). $^{13}$C-NMR (DMSO-d$_6$, 300 MHz) δ 164, 138, 135, 131, 130, 129, 128, 127. IR (powder, ATR) 3479, 3378, 1711, 1664, 1606, 1577, 1437, 1416, 1366, 1341, 1275, 1250, 1199, 1151, 1127, 1061, 1028, 1015, 984, 890, 854, 828, 767, 752, 719 cm$^{-1}$. UV-Vis [λ/nm (log ε/M$^{-1}$ cm$^{-1}$), 15.0 μM in DMF] 380 (4.40), 360 (4.38), 345(sh) (4.21). Anal. Calcd for $(C_{26}H_{16}B_2N_2O_8)$: C, 61.71; H, 3.19; N, 5.54. Found: C, 62.31; H, 3.21; N, 5.39.

Benzene-1,4-bis(phenylethynyl) diboronic acid (4). 4-iodophenylboronic acid (880 mg, 3.55 mmol) and 1,4-diethynylbenzene (205 mg, 1.63 mmol) were dissolved in THF (25 mL) and ethyldiisopropylamine (10 mL) and the solution was sparged with N$_2$ for 30 minutes. CuI (63 mg, 0.33 mmol) and Pd(PPh$_3$)$_4$ (43 mg, 0.037 mmol) were added and the solution was sparged with N$_2$ for another 30 minutes. The resulting pale yellow mixture was stirred at rt for 12 hours, during which a white precipitate formed. The pale yellow solid was recovered by filtration and rinsed with EtOAc (20 mL). The solid was suspended in EtOAc (30 mL), which washed with brine (30 mL) and H$_2$O (3×30 mL), and the solvent removed to yield 513 mg (86%) of the PPE diboronic acid 4 as a white solid. 4: $^1$H-NMR (DMSO-d$_6$, 300 MHz) δ8.20 (s, 4H); 7.84 (d, J=7.5 Hz, 4H); 7.60 (d, J=3 Hz, 4H); 7.54 (d, J=7.5 Hz, 4H). $^{13}$C-NMR (DMSO-d$_6$, 300 MHz) δ 135, 133, 130, 123, 122, 92,90. MALDI-MS m/z (%) 365.1 (43, M$^+$); 366.1 (100, M$^+$+1); 367.1 (27, M$^+$+2), 368.1 (6, M$^+$+3). IR (powder, ATR) 3351, 1701, 1658, 1592, 1576, 1505, 1491, 1434, 1401, 1358, 1256, 1199, 1183, 1143, 1088, 1021, 957, 857, 831, 808, 743, 693 cm$^{-1}$. UV-Vis [λ/nm (log ε/M$^{-1}$ cm$^{-1}$), 9.4 μM in DMF] 350 (4.63), 329 (4.83), 321(sh) (4.75). Em (λ/nm in DMF, λ$_{ex}$=350 nm) 376, 387, 400(sh). Anal. Calcd for $(C_{22}H_{16}B_2O_4)$: C, 72.20; H, 4.41. Found: C, 69.62; H, 4.37.

Graphene Growth. Single-layer graphene was grown on 25 μm-thick copper foil using previously reported chemical vapor deposition methods. A layer of PMMA (50 nm) was spin-coated on top of the graphene and the copper was etched using aqueous FeCl$_3$. The graphene was then transferred to fused SiO$_2$ and the PMMA removed by washing first with chloroform then isopropyl alcohol. The SLG/SiO$_2$ was finally calcined at 300° C. for 2.5 hours.

General procedure for ZnPc COF film growth on SLG. The appropriate diboronic acid (0.109 mmol) and zinc octahydroxyphthalocyanine (0.035 g, 0.050 mmol) were added to a 15 mL cylindrical pressure vessel and suspended in a mixture of 1,4-dioxane, methanol, N,N-dimethylacetamide, and 1,2-dichlorobenzene (v/v 3:1:2:1; 3.0 mL). After capping, the mixture was sonicated for 30 minutes and a graphene-containing substrate was added. The sealed vessel was heated in a 120° C. oven for 24 hours. The vessel was cooled to room temperature and the resulting green powder was recovered by filtration and dried under vacuum. The graphene-containing substrate was submerged in anhydrous toluene and sonicated for 5 seconds, and finally dried under vacuum.

C. NMR Spectra. The COFs were characterized by NMR spectroscopy.

D. FTIR Spectra. The COF powders were characterized by FTIR spectra.

E. UV-Vis-NIR Characterization. The COF powders were characterized by UV-Vis-NIR.

F. Simulation & Refinement of the COF Structures. Molecular modeling of the COFs were carried out using the Materials Studio (ver. 5.0) suite of programs by Accelrys. The unit cell precursors were defined as the model structures shown. The initial structures were geometry-optimized using the MS Forcite molecular dynamics module (Universal force fields, Ewald summations) and used to estimate the a and b lattice parameters in initial $D_1$ crystals with γ angles of 90° (hydrogens omitted for calculation). Interlayer spacings c were initially chosen as 3.34 Å with 90° angles and the crystal structures were again geometry-optimized using Forcite. The MS Reflex Plus module was then used to calculate the expected PXRD patterns, which matched the experimentally-observed patterns closely in peak position and intensity (line broadening from crystallite size was not calculated). After re-adjusting the lattice parameters based on experiment, the atom positions were used to design crystals of $D_{4h}$ (P4/mmm) symmetry. The observed diffraction patterns were subjected to Pawley refinement wherein peak profile and line shape parameters were refined using the Pseudo-Voigt peak shape function and asymmetry was corrected using the Berar-Baldinozzi function. The refinement was applied to the calculated lattice, producing the refined PXRD profiles.

G. Thermogravimetric Analysis. TGA traces of the COFs were obtained up to 600° C. using a linear 10° C./min ramp method. The COFs were characterized by TGA H. Surface Area Measurements. The COFs have surface certain surface areas.

Figure 24:
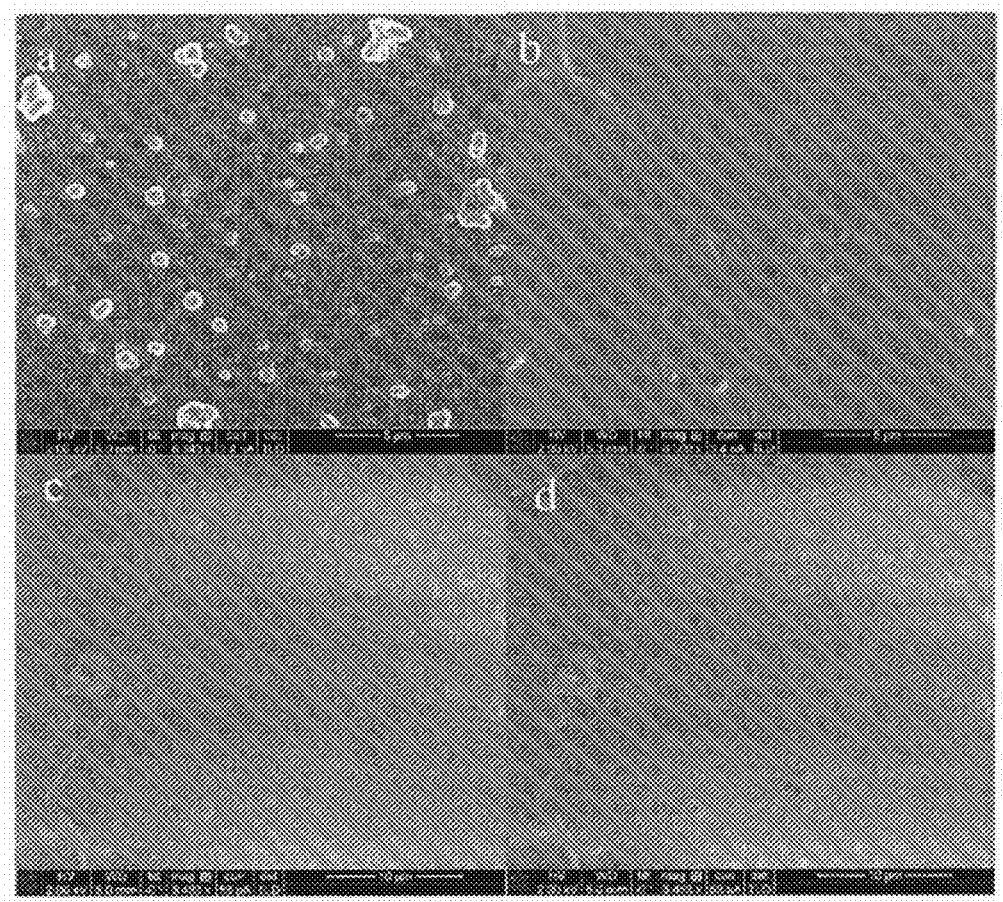
FIG. 24. Top down SEM of examples of (a) ZnPc-Py COF film, (b) ZnPc-DPB COF film, (c) ZnPc-NDI COF film, and (d) ZnPc-PPE COF film.

I. Scanning Electron Microscopy. The COFs were characterized by scanning electron microscopy as shown in FIG. 24.

Figure 25:
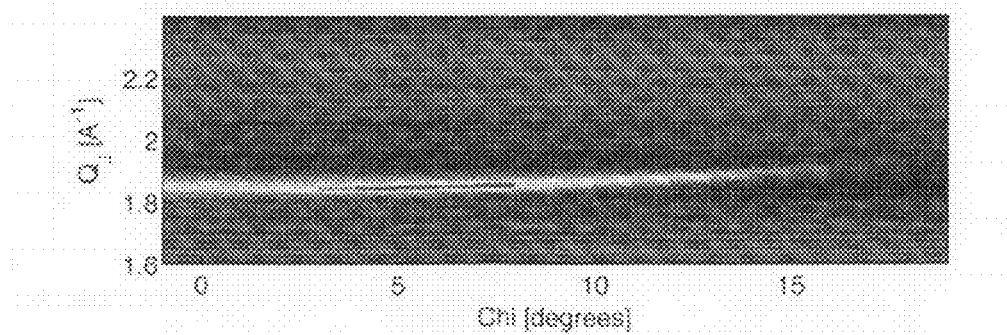
FIG. 25. Higher resolution x-ray reflectivity of an example of a ZnPc-DPB COF film. Background subtracted off-specular X-ray reflectivity of ZnPc-DPB COF film showing improved resolution compared to FIG. 7c.
Figure 26:
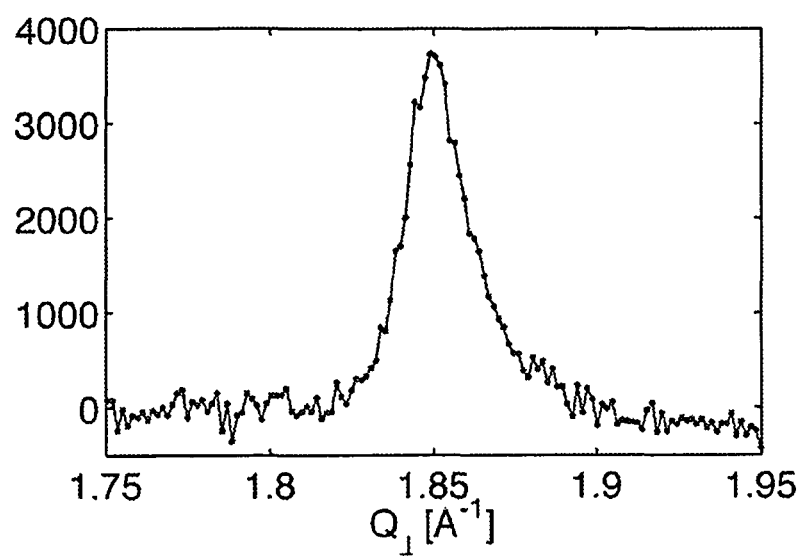
FIG. 26. 2-D projection of the intensity along $Q_\infty$ at Chi=4.5 degrees. The FWHM of this peak gives the average domain size along the c-axis. For this sample, the FWHM is 0.02 Å$^{-1}$ corresponding to a 31 nm (94 layers) correlation length.

J. Higher Resolution X-ray Reflectivity of ZnPc-DPB COF film. This is shown in FIGS. 25-26.

EXAMPLE 7

Example of structural data for examples of COF films.

TABLE 1

Fractional atomic coordinates for unit cell of ZnPc-Py COF calculated using the Materials Studio ver.5.0 modeling program.
3D Tetragonal, $D_{4h}$
(P4/mmm)
a = b = 26.980 Å, c = 3.338 Å

| atom | x | y | z |
|---|---|---|---|
| C1 | 0.027462 | 0.500000 | 0.50000 |
| C2 | 0.027462 | 0.410860 | 0.50000 |
| C3 | 0.053706 | 0.455430 | 0.50000 |
| C4 | 0.105674 | 0.455430 | 0.50000 |
| C5 | 0.131288 | 0.500000 | 0.50000 |
| C6 | 0.265000 | 0.475000 | 0.50000 |
| C7 | 0.309000 | 0.450000 | 0.50000 |
| C8 | 0.355000 | 0.475000 | 0.50000 |
| C9 | 0.401000 | 0.462000 | 0.50000 |
| O1 | 0.212025 | 0.546591 | 0.50000 |
| B1 | 0.182823 | 0.500000 | 0.50000 |
| N1 | 0.430000 | 0.500000 | 0.50000 |
| N2 | 0.416000 | 0.584000 | 0.50000 |
| Zn1 | 0.500000 | 0.500000 | 0.50000 |

TABLE 2

Fractional atomic coordinates for unit cell of ZnPc-DPB COF calculated using the Materials Studio ver.5.0 modeling program.
3D Tetragonal, $D_{4h}$
(P4/mmm)
a = b = 32.183 Å, c = 3.356 Å

| atom | x | y | z |
|---|---|---|---|
| C1 | 0.020491 | 0.500000 | 0.50000 |
| C2 | 0.057698 | 0.500000 | 0.50000 |
| C3 | 0.102075 | 0.500000 | 0.50000 |

TABLE 2-continued

Fractional atomic coordinates for unit cell of ZnPc-DPB COF calculated using the Materials Studio ver.5.0 modeling program.
3D Tetragonal, $D_{4h}$
(P4/mmm)
a = b = 32.183 Å, c = 3.356 Å

| atom | x | y | z |
|---|---|---|---|
| C4 | 0.123748 | 0.464739 | 0.50000 |
| C5 | 0.166807 | 0.464739 | 0.50000 |
| C6 | 0.188528 | 0.500000 | 0.50000 |
| C7 | 0.300642 | 0.480551 | 0.50000 |
| C8 | 0.337406 | 0.457860 | 0.50000 |
| C9 | 0.373823 | 0.480551 | 0.50000 |
| C10 | 0.414478 | 0.469042 | 0.50000 |
| O1 | 0.261315 | 0.464137 | 0.50000 |
| B1 | 0.236652 | 0.500000 | 0.50000 |
| N1 | 0.440321 | 0.500000 | 0.50000 |
| N2 | 0.428054 | 0.428054 | 0.50000 |
| Zn1 | 0.500000 | 0.500000 | 0.50000 |

TABLE 3

Fractional atomic coordinates for unit cell of ZnPc-NDI COF calculated using the Materials Studio ver.5.0 modeling program.
3D Tetragonal, $D_{4h}$
(P4/mmm)
a = b = 35.701 Å, c = 3.361 Å

| atom | x | y | z |
|---|---|---|---|
| C1 | 0.019879 | 0.500000 | 0.50000 |
| C2 | 0.019879 | 0.433099 | 0.50000 |
| C3 | 0.039699 | 0.466552 | 0.50000 |
| C4 | 0.079187 | 0.466552 | 0.50000 |
| C5 | 0.140886 | 0.500000 | 0.50000 |
| C6 | 0.162059 | 0.466552 | 0.50000 |
| C7 | 0.201335 | 0.466552 | 0.50000 |
| C8 | 0.221662 | 0.500000 | 0.50000 |
| C9 | 0.319419 | 0.480860 | 0.50000 |
| C10 | 0.352942 | 0.460236 | 0.50000 |
| C11 | 0.386323 | 0.480974 | 0.50000 |
| C12 | 0.423494 | 0.470264 | 0.50000 |
| O1 | 0.095827 | 0.435714 | 0.50000 |
| O2 | 0.285292 | 0.467504 | 0.50000 |
| B1 | 0.263921 | 0.500000 | 0.50000 |
| N1 | 0.099281 | 0.500000 | 0.50000 |
| N2 | 0.447162 | 0.500000 | 0.50000 |
| N3 | 0.434520 | 0.434520 | 0.50000 |
| Zn1 | 0.500000 | 0.500000 | 0.50000 |

TABLE 4

Fractional atomic coordinates for unit cell of ZnPc-PPE COF calculated using the Materials Studio ver.5.0 modeling program.
3D Tetragonal, $D_{4h}$
(P4/mmm)
a = b = 38.533 Å, c = 3.367 Å

| atom | x | y | z |
|---|---|---|---|
| C1 | 0.018677 | 0.468853 | 0.50000 |
| C2 | 0.038444 | 0.500000 | 0.50000 |
| C3 | 0.078109 | 0.500000 | 0.50000 |
| C4 | 0.110866 | 0.500000 | 0.50000 |
| C5 | 0.150530 | 0.500000 | 0.50000 |
| C6 | 0.170299 | 0.468853 | 0.50000 |
| C7 | 0.207616 | 0.468853 | 0.50000 |
| C8 | 0.227438 | 0.500000 | 0.50000 |
| C9 | 0.327400 | 0.481973 | 0.50000 |
| C10 | 0.359425 | 0.462877 | 0.50000 |
| C11 | 0.391299 | 0.482008 | 0.50000 |
| C12 | 0.426676 | 0.471666 | 0.50000 |
| O1 | 0.293260 | 0.468194 | 0.50000 |
| B1 | 0.270958 | 0.500000 | 0.50000 |

TABLE 4-continued

Fractional atomic coordinates for unit cell of ZnPc-PPE COF calculated using the Materials Studio ver.5.0 modeling program.
3D Tetragonal, $D_{4h}$
(P4/mmm)
a = b = 38.533 Å, c = 3.367 Å

| atom | x | y | z |
|---|---|---|---|
| N1 | 0.437864 | 0.437864 | 0.50000 |
| N2 | 0.448380 | 0.500000 | 0.50000 |
| Zn1 | 0.500000 | 0.500000 | 0.50000 |

While the invention has been particularly shown and described with reference to specific embodiments (some of which are preferred embodiments), it should be understood by those having skill in the art that various changes in form and detail may be made therein without departing from the spirit and scope of the present invention as disclosed herein.

What is claimed is:

1. A multilayer structure comprising a covalent organic framework (COF) layer in contact with a template polycyclic aromatic carbon (PAC) layer having a first side and a second side, wherein the COF layer has pores and the PAC layer is in contact with a substrate, such that the COF layer is in contact with the first side of the PAC layer and the substrate is in contact with the second side of the PAC layer,
   wherein the COF layer is aligned to a surface of the substrate, and
   the COF layer comprises at least 3 molecular layers and there is no detectible stacking fault in the 3 molecular layers.

2. The multilayer structure of claim 1, wherein the substrate is a copper, copper-coated silicon, fused silica, or silicon carbide.

3. The multilayer structure of claim 1, wherein the COF layer comprises a COF selected from the group consisting of COF-5, TP-COF, NiPc-PBBA COF, ZnPc-Py COF, ZnPc-DPB COF, ZnPc-NDI COF, and ZnPc-PPE COF.

4. The multilayer structure of claim 1, wherein the COF layer has a thickness of 5 nm to 1 micron.

5. The multilayer structure of claim 1, wherein the pores of the COF layer have a diameter of 1 nm to 6 nm.

6. The multilayer structure of claim 1, wherein the COF layer has an average grain size of at least 5 unit cells.

7. The multilayer structure of claim 1, wherein stacking faults are determined by x-ray diffraction, scanning electron microscopy, or transmission electron microscopy.

8. The multilayer structure of claim 1, wherein the COF layer comprises at least 10 molecular layers and there is no detectible stacking fault in the 10 molecular layers.

9. The multilayer structure of claim 1, wherein the pores are perpendicular to the PAC layer.

10. The multilayer structure of claim 1, wherein the COF layer is patterned.

11. The multilayer structure of claim 1, wherein the PAC layer is graphene or graphite.

12. The multilayer structure of claim 2, wherein the PAC layer is single-layer graphene.

13. The multilayer structure of claim 1, wherein the COF layer exhibits a mosaicity of 0 to 13.

14. The multilayer structure of claim 13, wherein the mosaicity is determine by x-ray diffraction.

15. A method for forming a covalent organic framework (COF) layer in contact with a template polycyclic aromatic carbon (PAC) layer having a first side and a second side, wherein the COF layer has pores and the PAC layer is in contact with a substrate, such that the COF layer is in contact with the first side of the PAC layer and the substrate is in contact with the second side of the PAC layer comprising the step of:
   contacting a subunit compound with a multifunctional linker compound in the presence of a PAC layer, wherein the PAC layer is in contact with a substrate, and a solvent, under conditions such that at least two subunit compounds react with a multifunctional linker compound to form at least one covalent bond and a COF layer is formed on the PAC layer, wherein the COF layer is aligned to a surface of the substrate the COF layer comprises at least 3 molecular layers and there is no detectable stacking fault in the 3 molecular layers.

16. The method of claim 15, wherein the PAC layer is graphene or graphite.

17. The method of claim 15, wherein COF layer has at least one covalent bond selected from an imine bond, a hydrazone bond, a triazine bond and a boronate ester bond.

18. The method of claim 15, wherein the subunit compound comprises at least two catechol moieties and the multifunctional linker compound comprises at least two boronic acid moieties.

19. A device comprising the covalent organic framework (COF) layer of claim 1 or the COF layer made using the method of claim 15.

20. The device of claim 19, wherein the device is selected from the group consisting of a solar cell, a flexible display, a lighting device, a RFID tag, a sensor, a photoreceptor, a battery, a capacitor, a gas storage device, and a gas-separation device.

* * * * *

UNITED STATES PATENT AND TRADEMARK OFFICE
CERTIFICATE OF CORRECTION

PATENT NO. : 11,213,800 B2
APPLICATION NO. : 13/821136
DATED : January 4, 2022
INVENTOR(S) : William R. Dichtel et al.

Page 1 of 6

It is certified that error appears in the above-identified patent and that said Letters Patent is hereby corrected as shown below:

In the Specification
Column 3, Line 14, "Q'," should be -- Q⊥, --.

Column nos. 7-8, Line nos. 34-50 (approx.), " 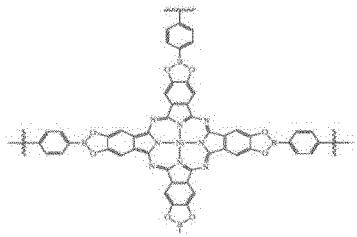 " should be 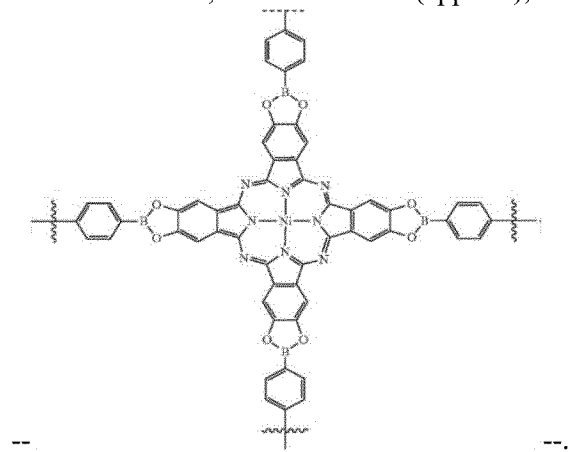 --.

Signed and Sealed this
First Day of August, 2023

Katherine Kelly Vidal
*Director of the United States Patent and Trademark Office*

CERTIFICATE OF CORRECTION (continued) Page 2 of 6
U.S. Pat. No. 11,213,800 B2

Column nos. 9-10, Line no. 2, " 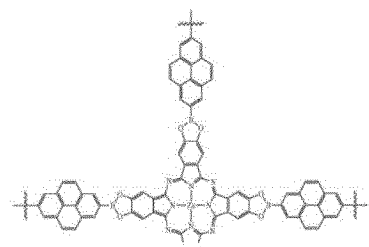 " should be

-- 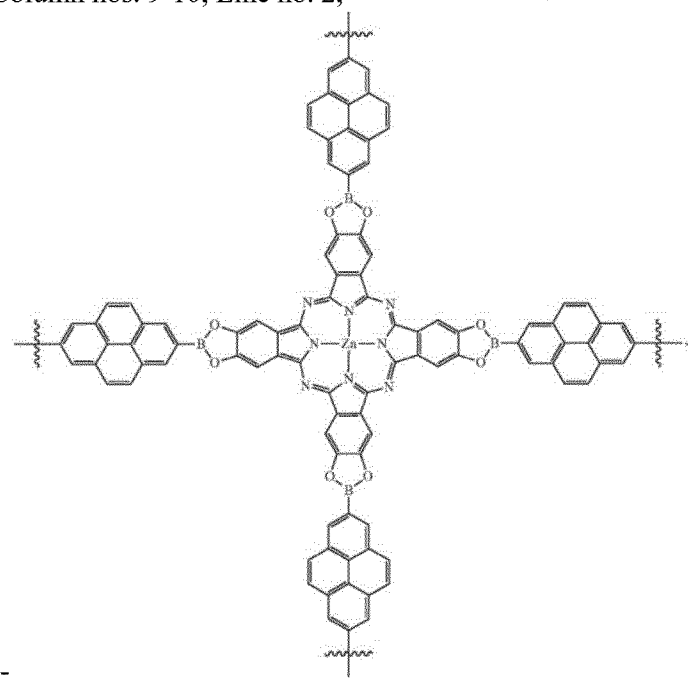 --.

Column nos. 9-10 and 11-12, Line nos. 3, 2 (respectively), " 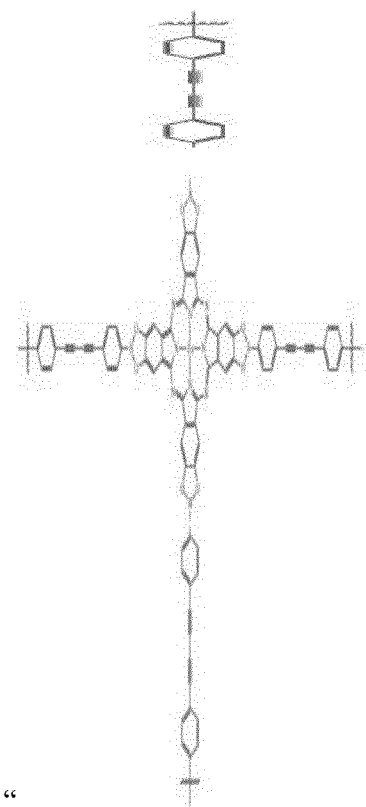 " should be 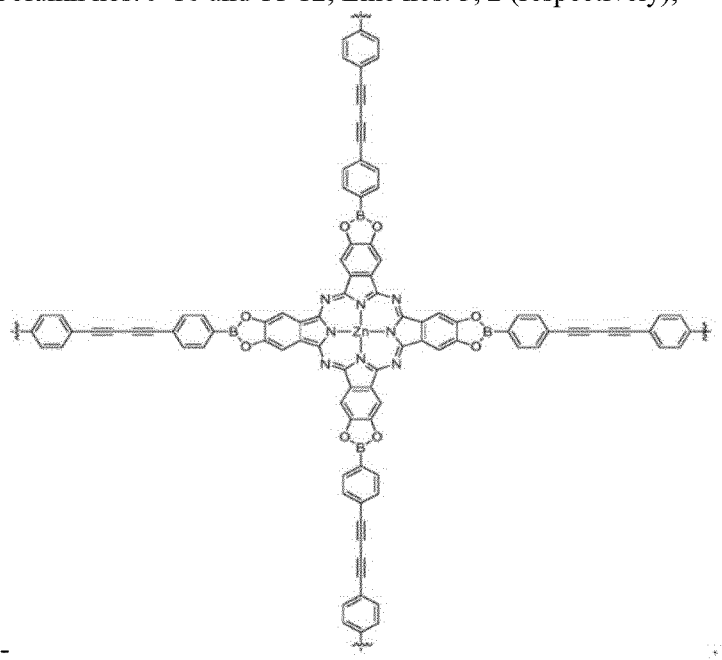 --.

CERTIFICATE OF CORRECTION (continued) Page 4 of 6
U.S. Pat. No. 11,213,800 B2

Column nos. 11-12 and 13-14, Line nos. 3, 2-3 (respectively),

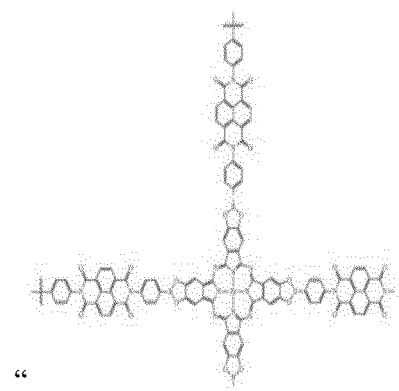

"

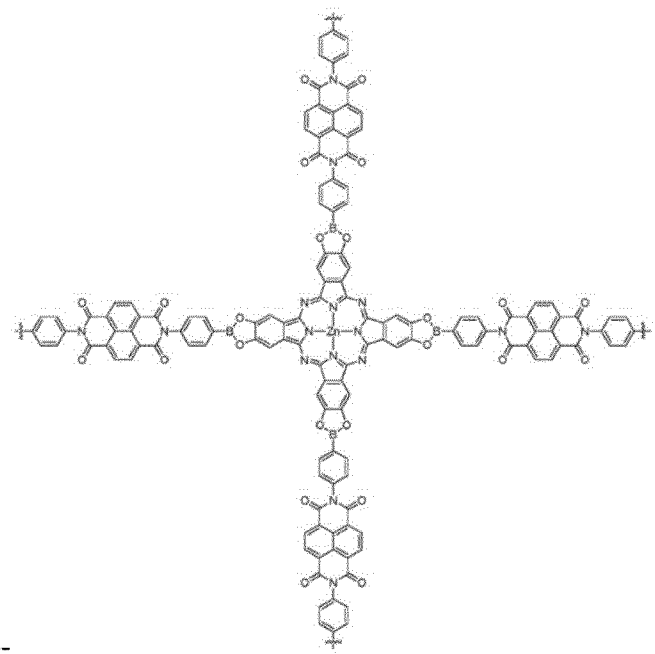" should be

-- -- .

CERTIFICATE OF CORRECTION (continued)
U.S. Pat. No. 11,213,800 B2

Column nos. 13-14 and 15-16, Line nos. 4 and 2-3 (respectively),

" 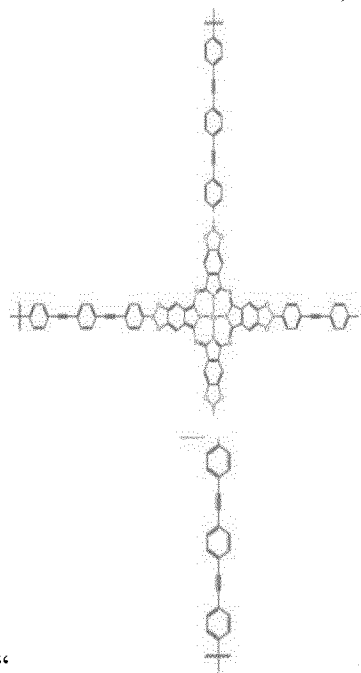 " should be

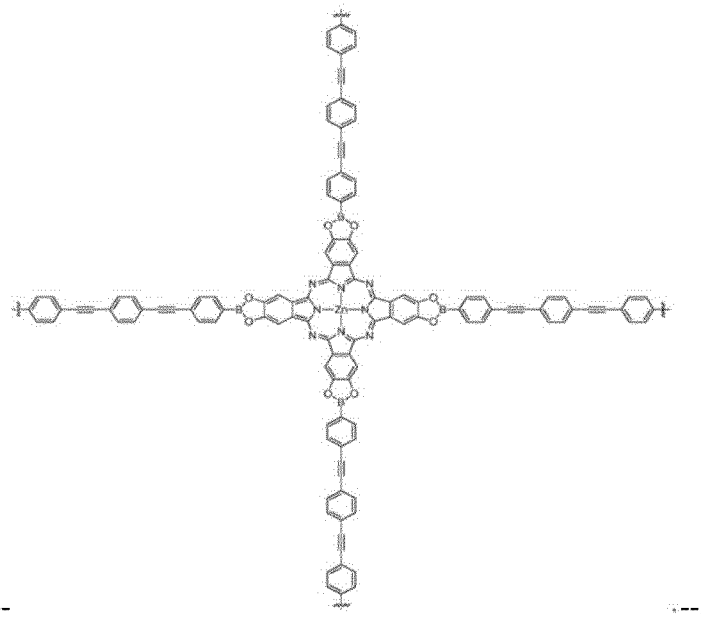

Column 30, Line 27, "Q-" should be -- Q∞ --.
Column 31, Line 58, "cc" should be -- α --.
Column 31, Line 61, "(v/2)" should be -- (δ/2) --.
Column 33, Line 10, "λ" should be -- χ --.
Column 34, Line 27, "(stacking" should be -- stacking --.
Column 35, Line 35, "60," should be -- 6f), --.
Column 36, Line 27, "MeOH: N,N-" should be -- MeOH:N,N- --.
Column 37, Line 8, "20" should be -- 2θ --.

CERTIFICATE OF CORRECTION (continued)
U.S. Pat. No. 11,213,800 B2

Column 37, Line 22, "Ga+LIM" should be -- Ga+ LIM --.
Column 38, Line 1, "cc" should be -- α --.
Column 40, Line 25 (approx.), "δ8.20" should be -- δ 8.20 --.
Column 40, Line 65, "(ver. 5.0)" should be -- (ver.5.0) --.